(12) United States Patent
Givens et al.

(10) Patent No.: US 6,200,895 B1
(45) Date of Patent: Mar. 13, 2001

(54) METHOD OF FORMING AN ELECTRICAL CONNECTION

(75) Inventors: John H. Givens; E. Allen McTeer, both of Meridian, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 09/248,091

(22) Filed: Feb. 10, 1999

Related U.S. Application Data

(62) Division of application No. 08/926,761, filed on Sep. 10, 1997.

(51) Int. Cl.$^7$ .................. H01L 21/4763; H01L 21/44
(52) U.S. Cl. .................. 438/688; 438/648; 438/649; 438/653; 438/660; 438/664; 438/685
(58) Field of Search .................. 438/648, 654, 438/629, 646, 685, 649, 680, 660, 677, 664, 688, 653

(56) References Cited

U.S. PATENT DOCUMENTS

| | | | |
|---|---|---|---|
| 5,534,463 | 7/1996 | Lee et al. | 437/195 |
| 5,550,084 * | 8/1996 | Anjum et al. | 438/664 |
| 5,567,652 | 10/1996 | Nishio | 437/200 |
| 5,644,166 | 7/1997 | Honeycutt et al. | 257/754 |
| 5,672,543 | 9/1997 | Chang et al. | 437/192 |
| 5,789,317 | 8/1998 | Batra et al. | 438/642 |
| 5,869,902 | 2/1999 | Lee et al. | 257/773 |

* cited by examiner

*Primary Examiner*—John F. Niebling
*Assistant Examiner*—Ha Tran Nguyen
(74) *Attorney, Agent, or Firm*—Workman, Nydegger & Seeley

(57) ABSTRACT

The present invention relates to high aspect-ratio electrical connections, wiring trenches, and methods of forming the same in semiconductor devices. In particular, the present invention relates to formation of contacts with refractory metal and/or refractory metal nitride liners that assist in filling of the contacts. Additionally disclosed is the combination of shallow junction fabrication and high aspect-ratio contact formation to form contacts between a shallow junction and microcircuitry wiring. More particularly, the present invention relates to aluminum filled contacts that fill contact corridors, trenches, or vias in semiconductor devices that are initially lined with a titanium layer and at least one other layer. Preferred other layers include CVD, PVD, or reacted TiN, Co, Ge, and Si.

21 Claims, 10 Drawing Sheets

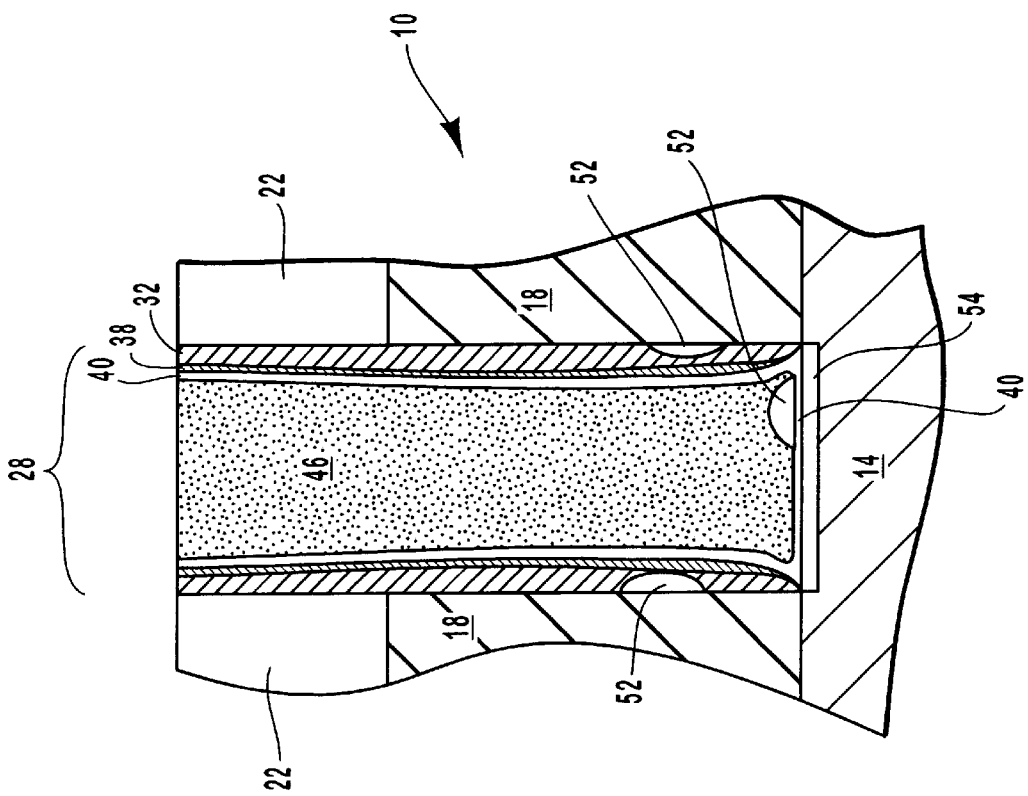
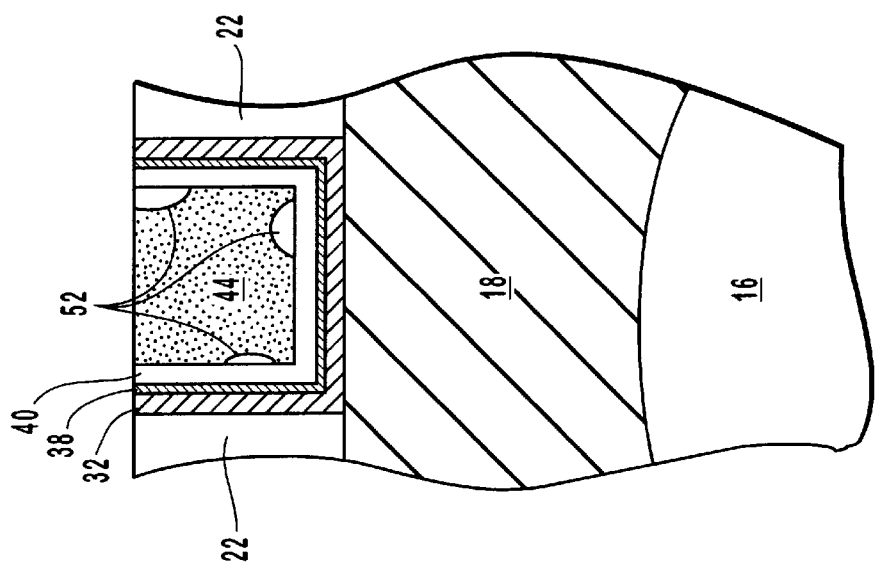
FIG. 5B
FIG. 5A

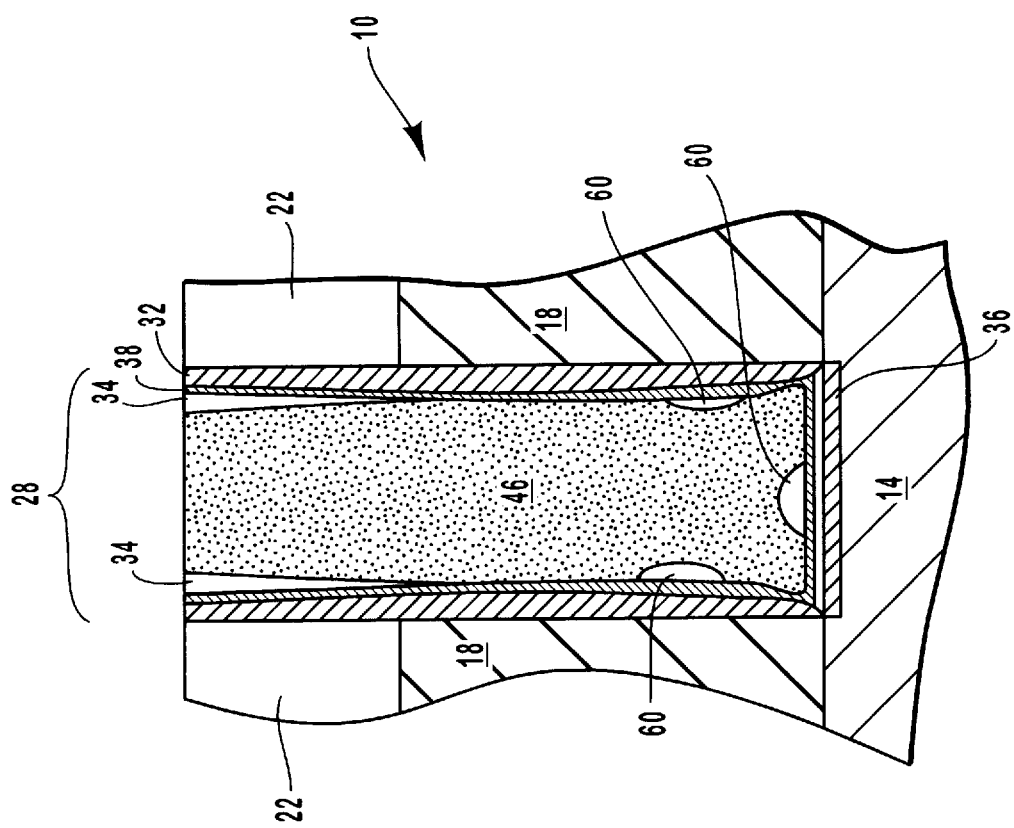
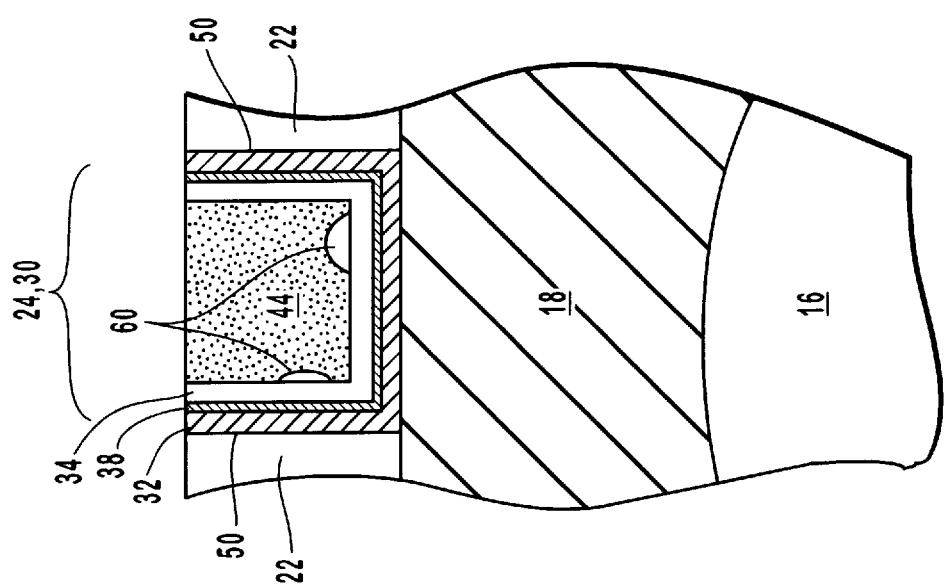
FIG. 6B
FIG. 6A

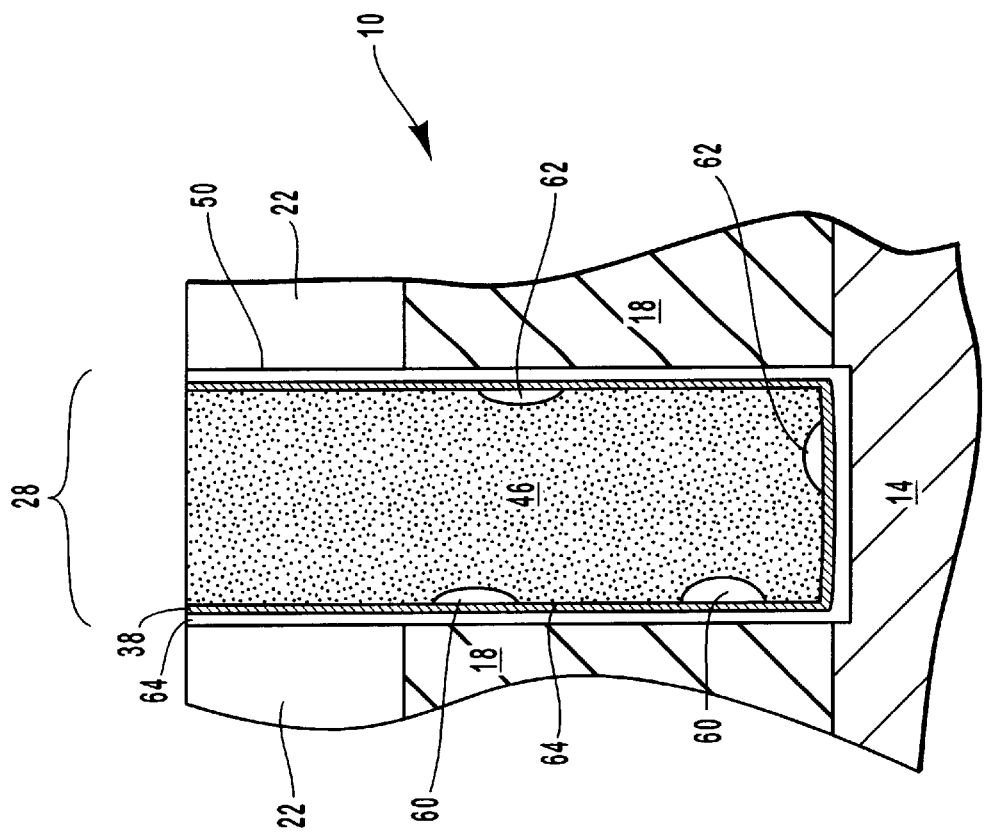
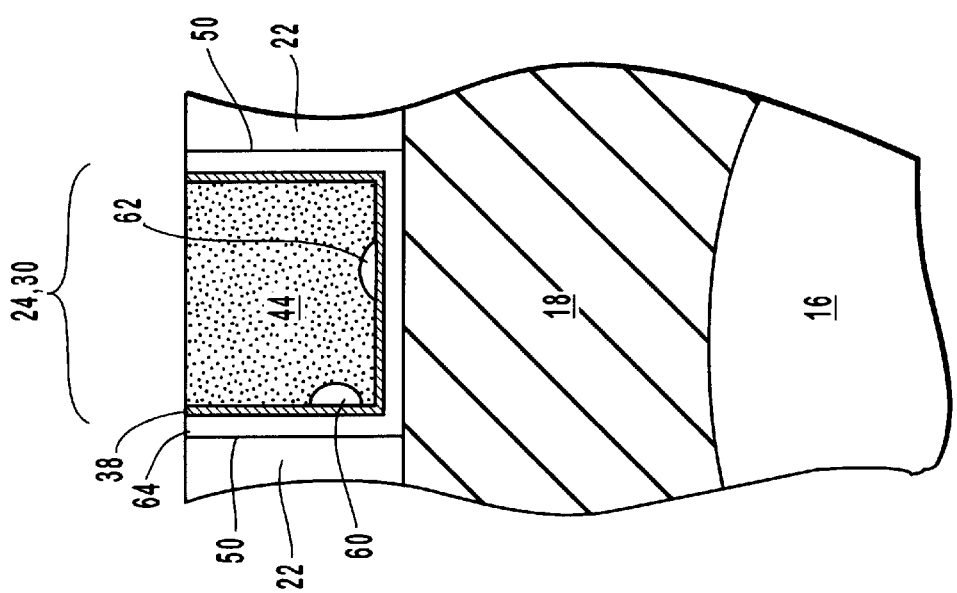

METHOD OF FORMING AN ELECTRICAL CONNECTION

This application is a divisional of application Ser. No. 08/926,761, filed on Sep. 10, 1997, which is incorporated herein by reference.

BACKGROUND OF THE INVENTION

1. The Field of the Invention

The present invention relates in part to the formation of shallow junctions in semiconductor devices. The present invention also relates to high aspect-ratio contacts and methods of forming the same in semiconductor devices. In particular, the present invention relates to formation of contacts with refractory metal and refractory metal nitride liners that assist in filling of the contacts, which contacts are incorporated in a circuit with semiconductor devices. Additionally disclosed is the combination of shallow junction formation and high aspect-ratio contacts that form interconnects between a shallow junction and semiconductor device wiring. More particularly the present invention relates to metal filled contacts that fill contact holes in semiconductor devices that are initially lined with a titanium layer and at least one other layer. Other preferred layers for lining the contact holes include titanium nitride, cobalt, germanium, and silicon.

2. The Relevant Technology

The process of miniaturization has the goal of increasing the density of the count of semiconductor devices in a given unit area. Miniaturization requires reducing the size, both lateral and vertical, of semiconductor devices and placing them closer to neighboring semiconductor devices.

Shallow junction structures have the advantage of forming faster devices, including faster on-off times and better control of gate lengths because gate lengths are of dimensions that are less than a quarter micron. Shallow junctions are defined as anything less than about 0.2 microns deep and where doping of the junction is in a concentration range of less than $10^{19}$ atoms/cm$^3$. At these minute dimensions, device leakage can become a disabling factor for such structures. Leakage in the pico amp range at these dimensions is detrimental in memory devices. For static random access memories (SRAMS) and logic devices on the other hand, charge leakage above the pico amp range can be tolerated.

In the formation of shallow junctions, detrimental charge leakage has the effect of not being able to turn off the device. For example, where a shallow junction is 0.15 microns deep and titanium silicide penetration into the active area is about 900 Å, charge leakage in the remaining unconsumed area of the active area is a substantial portion of the total charge that passes therethrough. This causes the problem of not being able to turn off the device.

Process control at these dimensions with titanium silicide formation also is problematic in that controlling titanium silicide encroachment into the shallow junction requires extra time, expense, and optimization that may be uneconomical for specific applications. Another difficulty with titanium and shallow junctions is due to the extreme thinness of titanium layers required for shallow junctions as defined above. A requisite titanium layer thickness can be easily penetrated and an aluminum silicide spike can form in the active area that disables the specific device by shorting out the active area. Titanium silicide also has a high surface tension associated with it compared to the silicon in active areas that causes spalling off from semiconductor substrate active areas and agglomeration with contact corridor walls.

Another difficulty in the process of miniaturization is forming contacts in ever-decreasing dimensions. For example, the aspect ratio of a contact as illustrated in FIG. 1, is defined as the height Y of the contact corridor divided by the width X. With ever-decreasing contact sizes, higher aspect ratios must be achieved. A high aspect ratio contact, for example, an aspect ratio of about 8:1 presents a difficulty for the microchip fabricator in miniaturization. Difficulties have been encountered in depositing aluminum lines and contacts by conventional sputtering processes when submicron high aspect ratio recesses are to be filled. As the openings become smaller and deeper, the bottom and sides of an opening receive fewer deposited metal ions than the top surface of the opening, with the result that the metal layer hangs over the opening, called "breadloafing." Thus over time, the bottom and sides of the opening receive inadequate amounts of metal and bread-loafing closes the opening before the opening is filled.

While the aluminum in the contact or metal line and the silicon in the semiconductor substrate active area must be electrically connected, it has become useful to use intermediate layers to provide better electrical connection to the silicon and to provide an electrical junction, while at the same time to provide a metallurgical barrier between silicon and aluminum to prevent spiking of the aluminum into the silicon. Spiking can interfere with the performance and reliability of the integrated circuit.

Conventionally, one method which has been used to accomplish the metallurgical barrier has been to form a layer of titanium over a semiconductor substrate at the contact exposed site to form a titanium silicide junction at the exposed site, and to form a titanium nitride layer elsewhere in that the titanium layer is formed in the presence of nitrogen. While this method accomplishes the metallurgical barrier by the formation of the titanium silicide junction, it often is inadequate to form the titanium nitride layer has a barrier because of the competing simultaneous formation of titanium silicide and titanium nitride at the titanium region that covers the exposed semiconductor substrate site. Titanium silicide also has the problem, as stated above, of imposing undesirable stresses between the titanium layer as formed upon the active area and the silicon material of which the active area is composed. As a balance is attempted to be struck between depositing a thin enough titanium layer that will not substantially consume the shallow junction active area, and sufficient titanium so as to not spall off from the active area, the ever-increasing pressure of miniaturization has caused a heightened interest in seeking an alternative method of forming the metallurgical barrier that serves simultaneously as an electric junction.

One prior art solution to this inadequate prior art method has been to form the titanium silicide barrier layer first and then to sputter additional titanium nitride over the titanium silicide or titanium silicide/titanium nitride layer. In this way, a sufficient thickness of titanium nitride may be formed to provide a desired thickness in a barrier layer.

Sputtered layers of titanium nitride have been used in integrated circuits as barrier layers for recesses such as contact holes, vias, and trenches. Sputter-deposited titanium nitride in a high aspect ratio contact, however, is not desirably conformal and the step coverage thereof within high aspect ratio recesses is poor. The result is an unacceptably thin or discontinuous titanium nitride barrier layer that lines the walls of the high aspect ratio contact.

As aspect ratios in recesses have increased, the need to get the sputtered aluminum metallization to substantially fill the recess has proved inadequate in spite of improved titanium nitride barrier layers. High pressure and/or temperature aluminum recess-filling techniques have been developed, but with ever-increasing pressure to miniaturize, filled recesses with aspect ratios that exceed 8:1 have been difficult or impossible to achieve.

It has been proposed to form the titanium nitride layer in a recess by chemical vapor deposition (CVD), for example by using titanium tetrachloride ($TiCl_4$) in the presence of $NH_3$, $H_2$ and Ar. Although the $TiCl_4$ CVD process has improved reflow techniques, substantially filled recesses with aspect ratios greater than about 5:1 have been elusive. One problem that has been realized is that aluminum reflow requires a substantially pristine refractory metal nitride surface, whereas interstitial titanium nitride layer impurities incident to the $TiCl_4$ CVD process cause the aluminum to become contaminated and to lose its relatively low-friction flowing ability across the titanium nitride layer that lines a recess being filled.

What is needed is a method of forming a shallow junction at or below a depth of about 0.2 microns without the problems of the prior art that include detrimental charge leakage, aluminum spiking due to a titanium layer that is too thin, spalling, and agglomeration.

What is also needed is a method of lining and substantially filling high aspect ratio recesses with aluminum metallization or equivalents in microelectronic device fabrication, where the aspect ratio exceeds 8:1.

What is also needed is a method of simultaneously forming a shallow junction below a depth of about 0.2 microns and of filling of a high aspect ratio recess with aluminum metallization or equivalents such that resistivity of the recess is minimized and the integrity of the shallow junction as designed is maintained.

SUMMARY OF THE INVENTION

In the microelectronics industry, a substrate refers to one or more semiconductor layers or structures which includes active or operable portions of semiconductor devices. In the context of this document, the term "semiconductor substrate" is defined to mean any construction comprising semiconductive material, including but not limited to bulk semiconductive material such as a semiconductor wafer, either alone or in assemblies comprising other materials thereon, and semiconductive material layers, either alone or in assemblies comprising other materials. The term substrate refers to any supporting structure including but not limited to the semiconductor substrates described above.

The present invention comprises various method embodiments for making electrical connections for semiconductor structures, and articles achieved by the methods. A shallow junction is an interface between differently configured conductivities in a semiconductor material that is less than about 0.2 microns deep. A high aspect ratio contact corridor or interconnect corridor is an electrical conduit with a length-to-width ratio that exceeds about 8:1. A high aspect ratio, shallow junction contact fabrication method of the present invention comprises formation of a metallurgical structure by the chemical combination of a refractory metallization material and silicon of the shallow junction and by filling a contact corridor with aluminum metallization. The shallow junction in the inventive method requires minimal consumption of silicon so as to avoid compromising the shallow junction.

Depressions in the inventive method are formed in the semiconductor structure. Typically, depressions are formed in dielectric materials such as boron phosphorus silicate glass (BPSG), oxide formed by tetraethyl ortho silicate (TEOS), or a nitride such as silicon nitride ($Si_3N_4$). The dielectric material may be used separately or in combination with other dielectric materials. Depressions include, but are not limited to, trenches, contact corridors, and interconnect corridors, referred to herein as vias. Contact corridors in this invention typically penetrate at least one dielectric layer and expose semiconductive material. Interconnect corridors in this invention typically penetrate at least one dielectric layer to expose an interlevel metallization line. Trenches typically penetrate into but not through a dielectric structure although they may also penetrate a first dielectric layer, but not a second adjoining dielectric layer.

Some preferred embodiments include the use of cobalt. Because of differing diffusivity affinities, thermal processing of a structure of silicon superposed by titanium and then by cobalt respectively will cause the cobalt to diffuse through the titanium and to chemically combine with the silicon. Thus, by the processing conditions of the present invention, cobalt silicide formation is preferential to titanium silicide formation upon an active area.

Metallization in the inventive method is typically formed from aluminum or aluminum alloys. Aluminum alloys include Al—Cu alloys, Al—Si alloys, Al—Cu—S alloys, Al—Ge and the like.

Thermal processing in the inventive method preferably uses a nitrogen atmosphere for rapid thermal annealing (RTA). The nitrogen diffuses through materials such as deposited titanium nitride to form a thermal titanium nitride with a titanium layer that is typically deposited first. RTA thus forms titanium nitride layers that are often between other layers.

Thermal processing in the inventive method also forms chemical or solid solution combinations from preferred materials. For example cobalt silicide is a preferred metallurgical junction that forms from silicon in a semiconductor substrate active area and from a cobalt layer. The stoichiometry is typically $CoSi_2$. However, the duration and temperature of an RTA, as well as the reaction-limiting starting materials that are present will cause the formation of combinations other than strict stoichiometric combinations. Thus, cobalt silicide can be $Co_xSi$ where x=0.1 to 10. Cobalt silicide forms stoichiometric combinations of CoSi and $Co_2Si$. Titanium silicide is another preferred metallurgical junction that forms from silicon in a semiconductor substrate active area and from titanium. The stoichiometry is typically $TiSi_2$, but combinations can be $Ti_xSi_y$ where x=1 to 5 and y=1 to 3. Germanium silicide also forms in a preferred embodiment. The stoichiometry is typically GeSi, but combinations can be $Ge_xSi_{1-x}$ where x=<0.99. Germanium aluminide also forms in a preferred embodiment. Titanium nitride also forms by thermal processing. The stoichiometry is typically TiN but combinations can be $Ti_xN$ where x=0.1 to 10. In all of the above combinations, there are preferred structures that have a stoichiometric gradient. For example, with titanium nitride, a gradient is preferred where the TiN will gradually change from a 50:50 ratio at a first titanium nitride surface to a 75:25 ratio at a second titanium nitride surface due to a thermal process that has been selectively stopped before complete nitridation of titanium has progressed.

In a first embodiment of the present invention, a dual-damascene/high-aspect ratio contact for a shallow junction application is fabricated by utilizing titanium and cobalt layers to be followed by aluminum pressure filling. In the first embodiment, a depression comprising a trench and/or a contact corridor is formed through at least one dielectric layer. A surface precleaning is carried out in a process that may typically be an HF dip or the like. Following precleaning of the surface, a titanium layer deposition is carried out by CVD for preferred step coverage in the depression. The titanium is used to consume any native oxide that grows upon the semiconductor substrate material, such as silicon, that is exposed during formation of the contact corridor.

A cobalt layer is formed substantially conformably upon the titanium layer, but most particularly at the bottom of the depression. An RTA process that uses a nitrogen atmosphere is carried out that causes the cobalt layer to diffuse through the titanium layer at the bottom of the contact corridor and to combine with silicon in the semiconductor substrate to form a cobalt silicide layer. Titanium from the titanium layer may form a titanium nitride layer by diffusion of the nitrogen atmosphere through the cobalt layer. Further processing comprises deposition of a titanium nitride layer, and a physical vapor deposition (PVD) of an aluminum metallization to form a bridge-like structure over the top of the semiconductor structure that bridges over the depression.

A pressure fill of the aluminum metallization follows wherein the aluminum metallization substantially fills the depression. Finally, chemical-mechanical polishing (CMP) is carried out to remove all material above the dielectric layer.

Depending upon the preferred application of the inventive method, the structure at the bottom of the contact corridor may comprise a cobalt silicide layer that may be superposed with an optional unreacted titanium layer. By selecting processing conditions, the titanium layer may be entirely consumed to form a thermal titanium nitride layer.

Because aluminum and its alloys are substantially insoluble in titanium nitride, pressure filling is facilitated such that the aluminum metallization will flow across the outer surfaces of the aforementioned layers without substantially intermingling.

In a second embodiment of the present invention, a disappearing mobility underlayer of germanium is deposited into the depression. The second embodiment comprises a surface pre-cleaning as set forth above, CVD of titanium, CVD of titanium nitride, RTA, CVD of germanium, followed by aluminum deposition, pressure filling of the aluminum, and CMP. During pressure filling, the germanium dissolves at least partially into the aluminum.

Germanium lowers the melting point of aluminum. Because of the lower temperatures of pressure filling made possible by the presence of germanium next to the aluminum metallization, the second embodiment maximizes aluminum flowability, reduces temperature and time requirements to achieve aluminum flow, and maximizes the robustness of the liners against aluminum diffusion due to the continuous nature of the reacted layers.

In a third embodiment of the present invention, a disappearing mobility underlayer of silicon is deposited into the depression. The third embodiment comprises surface pre-cleaning as set forth above, CVD of titanium, CVD of cobalt, RTA, CVD of silicon, followed by aluminum deposition, pressure filling, and CMP. During pressuring filling, the silicon dissolves at least partially into the aluminum. Silicon, like germanium in the second embodiment, lowers the melting point of aluminum.

Similar to the first embodiment, in the third embodiment the semiconductor structure fabricated is subject to RTA. Diffusion of the CVD cobalt layer through the titanium layer at the bottom of the contact corridor is accomplished and a cobalt silicide layer is formed upon the semiconductor substrate active area. A second HF dip is optional.

Unlike the PVD of a titanium nitride layer in the first embodiment, in the third embodiment the disappearing mobility silicon underlayer is deposited by CVD. Use of silicon in the third embodiment has the advantage of assisting in high aspect ratio contact formation and for shallow junction structures, formed separately or together where, in concert with cobalt that has diffused through the titanium to form a cobalt silicide layer, high aspect ratios and shallow junctions are formed simultaneously.

In fourth and fifth embodiments, the inventive method of the third embodiment is carried out sequentially up to and including deposition of a disappearing silicon underlayer. In the fourth and fifth embodiments, deposition of a silicon underlayer is followed by a second RTA. An RTA will cause, depending upon the duration and temperature, at least some of the silicon and perhaps all thereof to dissolve into the titanium layer. In the fifth embodiment, RTA is followed by a second CVD of a silicon layer to restore sufficient silicon within the depression to facilitate flowability of the aluminum metallization.

One quality of the fourth and fifth embodiments is that aluminum can be force-filled into high aspect ratio depressions under temperatures that economize the thermal budget. A preferred structure achieved by the fourth and fifth embodiments is formation of shallow junctions as previously defined. The shallow junction is achieved by minimizing silicon consumption at the bottom of the depression due to the presence of the cobalt silicide layer that forms and that acts as an aluminum diffusion barrier.

In sixth and seventh embodiments, formation of titanium and cobalt layers is followed by a first RTA and by CVD formation of a disappearing germanium underlayer. In the sixth embodiment, PVD formation of an aluminum metallization is carried out followed by pressure filling and CMP. The sixth embodiment comprises forming a single disappearing germanium underlayer deposition followed by a second RTA. Depending upon the specific application, the second RTA has substantially consumed all germanium and more germanium is needed to cause localized melting point lowering to facilitate flowability of the aluminum metallization. In the seventh embodiment, an optional second germanium underlayer deposition is carried out before forming the aluminum metallization. Germanium aluminide regions may form within the depression depending upon the process parameters.

In an eighth embodiment, a disappearing mobility underlayer of silicon is deposited into the depression. The eighth embodiment comprises surface pre-cleaning as set forth above, CVD of titanium, CVD of a silicon underlayer, RTA, CVD of a disappearing germanium underlayer, followed by aluminum deposition, pressure filling, and CMP.

RTA of the silicon and titanium layers is carried out under conditions optimized to form titanium silicide on an active area if the depression is a contact corridor, and to form a continuous titanium silicide layer on the sidewalls of the depression. Following RTA, a germanium underlayer is formed by CVD. Regions of germanium aluminide and/or aluminum silicide may be present within the depression depending upon the duration and temperature of the thermal processing.

In a ninth embodiment, a disappearing germanium mobility underlayer is used for metallization, such as back-end-of-line (BEOL) wiring, for a trench and/or a via. The semiconductor structure is subjected to a surface pre-clean as set forth above. Unlike all previously described embodiments, titanium is deposited by PVD. The ninth embodiment is preferred for depression filling where processing temperatures are held below those at which suicides form, for example metal suicides that would form at the bottom of a contact corridor. Process temperatures are held low so as not to melt interlevel metallization lines.

Following formation of a PVD titanium layer, a disappearing germanium underlayer is formed either by PVD or CVD. Aluminum metallization is next deposited by one of two alternative processes. A first alternative process to form the aluminum metallization layer comprises a two-step cold/hot combination deposit by PVD. A second alternative deposition process for forming the aluminum metallization layer comprises a slow/warm deposition process. The maximum temperature to be achieved in forming the aluminum metallization layer is in a range that prevents existing interlevel metallization from becoming fluid. Pressure filling of the aluminum metallization layer into a depression is carried out in a temperature range that prevents existing interlevel metallization from becoming fluid. Germanium can combine with titanium and/or aluminum to form titanium germanide or germanium aluminide within the sidewall due to the more omni-directional deposition of germanium characteristic of CVD.

The ninth embodiment is preferred for via formation and filling where it is otherwise problematic to form interconnects due to the existence of, for example, an existing interlevel metal line that would be subjected to destructive stressing at processing temperatures that may cause the existing interlevel metal line to become fluid. The ninth embodiment is also suited for processing with specialized dielectrics that are sensitive to conventional pressure fill processing.

In a tenth embodiment, the method of the second embodiment is repeated up to and including formation of a disappearing germanium underlayer. In the tenth embodiment, the technique of driving substantially all germanium out of the metallurgy after filling the aluminum metallization into the depression is carried out. In the tenth embodiment, an additional anneal is carried out following pressure filling, whereby substantially all germanium is removed by causing regions of germanium aluminide to migrate to a position in the semiconductor structure that will ultimately be removed by CMP. The technique for removing substantially all unwanted germanium from the semiconductor structure is carried out by an alloying treatment such as thermal soaking for a duration and at a temperature range that causes germanium to migrate.

These and other features will become more fully apparent from the following description and appended claims, or may be learned by the practice of the invention as set forth hereinafter.

BRIEF DESCRIPTION OF THE DRAWINGS

In order that the manner in which the above-recited and other advantages of the invention are obtained, a more particular description of the invention briefly described above will be rendered by reference to specific embodiments thereof which are illustrated in the appended drawings. The drawings are presented to illustrate both process and achieved structure, but they are presented only qualitatively as to dimensions. Understanding that these drawings depict only typical embodiments of the invention and are not therefore to be considered to be limiting of its scope, the invention will be described and explained with additional specificity and detail through the use of the accompanying drawings in which:

FIG. 5A illustrates a detail of a trench structure achieved by the method of the second embodiment, wherein a titanium layer is in contact with both trench sidewalls and trench bottom, a thermal titanium nitride layer is in contact with the titanium nitride layer, a deposited titanium nitride layer is in contact with the thermal titanium nitride layer, aluminum metallization fills the trench, and there are optional germanium aluminide regions.

FIG. 5B illustrates a detail section of a filled contact corridor with the structure achieved according to the second embodiment, in which a titanium silicide metallurgical junction is formed to create an electrical contact between a semiconductor active area and an aluminum metallization.

FIG. 6A illustrates a detail of a trench structure achieved by the process of the third embodiment, wherein the trench is filled with a deposited titanium layer, a reacted titanium nitride layer, a cobalt layer, a filled aluminum metallization, and there are optional residual aluminum silicide regions.

FIG. 6B illustrates a detail section of a filled contact corridor, wherein a diffused cobalt silicide layer makes contact with an active area of a semiconductor substrate, the contact corridor is lined from the sidewalls with a deposited titanium layer, a reacted titanium nitride layer, and an aluminum or aluminum alloy metallization that forms the interconnect, and there are optional aluminum silicide regions.

FIG. 9A illustrates a detail of a filled trench structure achieved according to the eighth embodiment, wherein a titanium silicide layer substantially conformably lines the trench, a reacted titanium nitride layer substantially conformably lines the titanium silicide layer, aluminum or aluminum alloy metallization substantially fills the trench, and wherein there are optional regions of both aluminum silicide and aluminum germanide.

FIG. 9B illustrates as detail section of a filled contact corridor, wherein a titanium silicide layer is formed upon the active area and the titanium silicide layer substantially conformably lines the bottom and sidewalls of the contact corridor, a reacted titanium nitride layer lines the titanium silicide bottom and sidewalls layer, metallization substantially fills the contact corridor, and there are optional regions of both aluminum germanide and aluminum silicide.

DETAILED DESCRIPTION OF THE PREFERRED EMBODIMENTS

In a first embodiment of the present invention, a dual-damascene/high-aspect ratio contact for a shallow junction is fabricated by utilizing titanium and cobalt layers to be followed by aluminum pressure filling.

Figure 1:
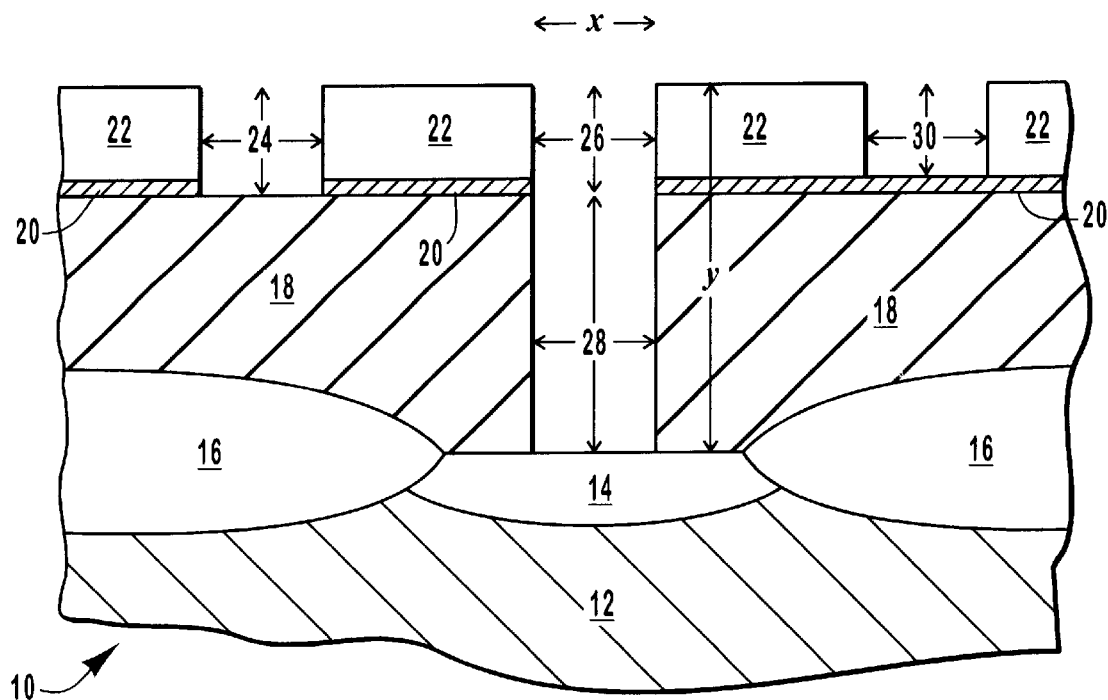
FIG. 1 is an elevational cross-sectional view of a semiconductor structure that includes a semiconductive substrate, an active area, field oxide regions, up to three dielectric layers, and patterning that includes both trench and contact corridor depressions formed in selected dielectric layers.

FIG. 1 illustrates a structure by which both an inventive method is carried out and an inventive structure is formed. In FIG. 1, a semiconductor structure 10 is depicted in a cross-sectional elevation view comprising a semiconductor substrate 12 that has an active area 14 therein, a field oxide region 16 grown upon semiconductor substrate 12, a first dielectric layer 18, a second dielectric layer 22, and an optional dielectric layer 20 lying therebetween. First dielectric layer 18 and second dielectric layer 22 are preferably composed of different materials, for example, first dielectric layer 18 may be composed of BPSG and second dielectric layer may be composed of TEOS. Optional dielectric layer 20 may be yet a different material, for example, a nitride such as $Si_3N_4$. Dielectric layers 18, 20, 22 are selected according to specific applications. For example, a preferred etch recipe will have different etch selectivities that can be used to achieve an etch result required for a specific application. In all subsequently presented embodiments, the illustrated structures presuppose the optional presence of optional dielectric layer 20.

Disposed upon optional dielectric layer 20, or upon first dielectric layer 18 (if optional dielectric layer 20 is not present) is second dielectric layer 22 that has been patterned with a mask (not shown) and etched. Etching has formed such structures as a first trench 24 that forms a depression through both second dielectric layer 22 and optional dielectric layer 20. Etching has also formed a second trench 26 that contains at the bottom of second trench 26, a contact corridor 28 that may have a cylindrical shape. Additionally, etching has formed a third trench 30 that forms a depression only into second dielectric layer 22, the etch of which has stopped on optional dielectric layer 20 if present. In semiconductor structure 10, it can be seen that preferred etch chemistries and preferred dielectric materials may be selected to achieve any of first trench 24, second trench 26 with contact corridor 28, or third trench 30 depending upon the preferred embodiment as applied.

Figure 2:
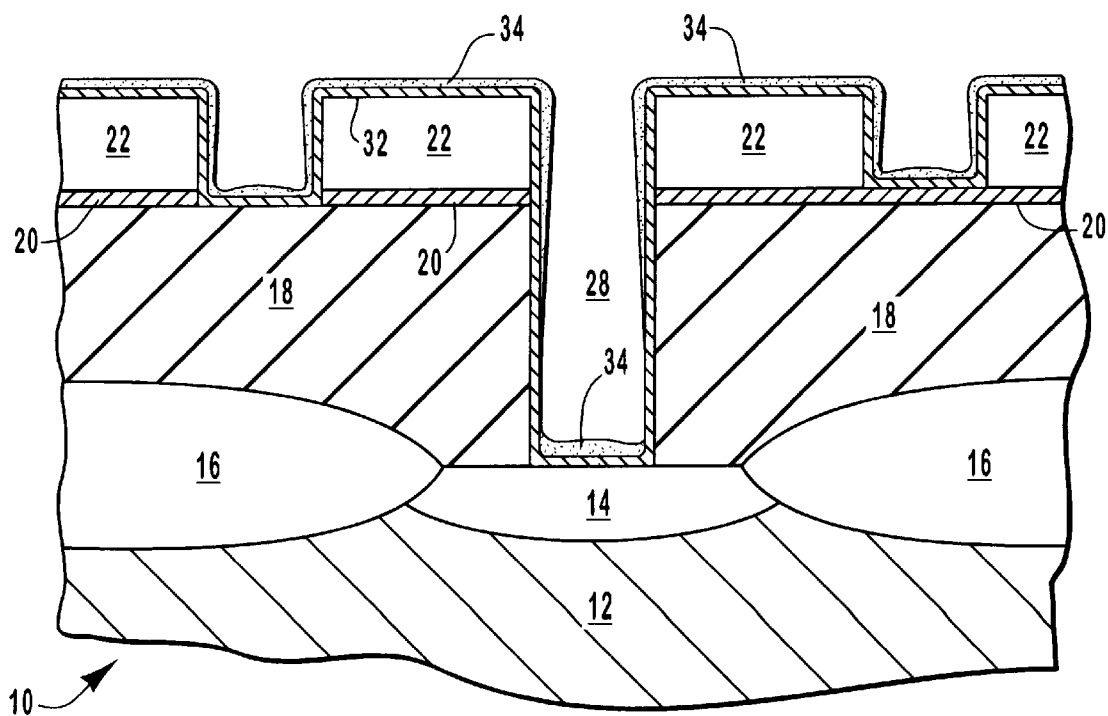
FIG. 2 is an illustration of processing of the semiconductor structure depicted in FIG. 1, wherein a titanium layer has been substantially conformably deposited upon exposed surfaces, preferably by CVD, followed by PVD of a cobalt layer.

The first embodiment comprises a surface precleaning that may typically be an HF dip or the like. The surface precleaning preferably will be selected to dissolve polymers and oxides. Following the surface precleaning, a titanium layer deposition is carried out by CVD to form a titanium layer 32 as illustrated in FIG. 2. Titanium is deposited by CVD to achieve a good step coverage and the titanium is used to consume any native oxide that grows upon the semiconductor substrate 12 at the bottom of contact corridor 28 as illustrated in FIG. 1. Process parameters are preferably selected in the CVD titanium process such that, for example, if the CVD Ti process is carried out using TiCl$_4$, no titanium silicide forms upon the exposed surface of semiconductor substrate 12 at the bottom of contact corridor 28.

The next portion of the first embodiment comprises forming a cobalt layer 34 upon titanium layer 32, but most particularly at the bottom of contact corridor 28. Preferably cobalt layer 34 is formed by PVD in order to assure a preferred bottom coverage at the bottom of contact corridor 28. The two processes of CVD of titanium to form titanium layer 32 and PVD of cobalt to form cobalt layer 34 are preferably carried out within a single cluster of deposition equipment, whereby the vacuum is not broken between the two processes. This cluster equipment method is used to minimize formation of oxide upon titanium layer 32. An oxide layer upon titanium layer 32 will prevent the desired diffusion of cobalt layer 34 through titanium layer 32 at the bottom of contact corridor 28.

Figure 3:
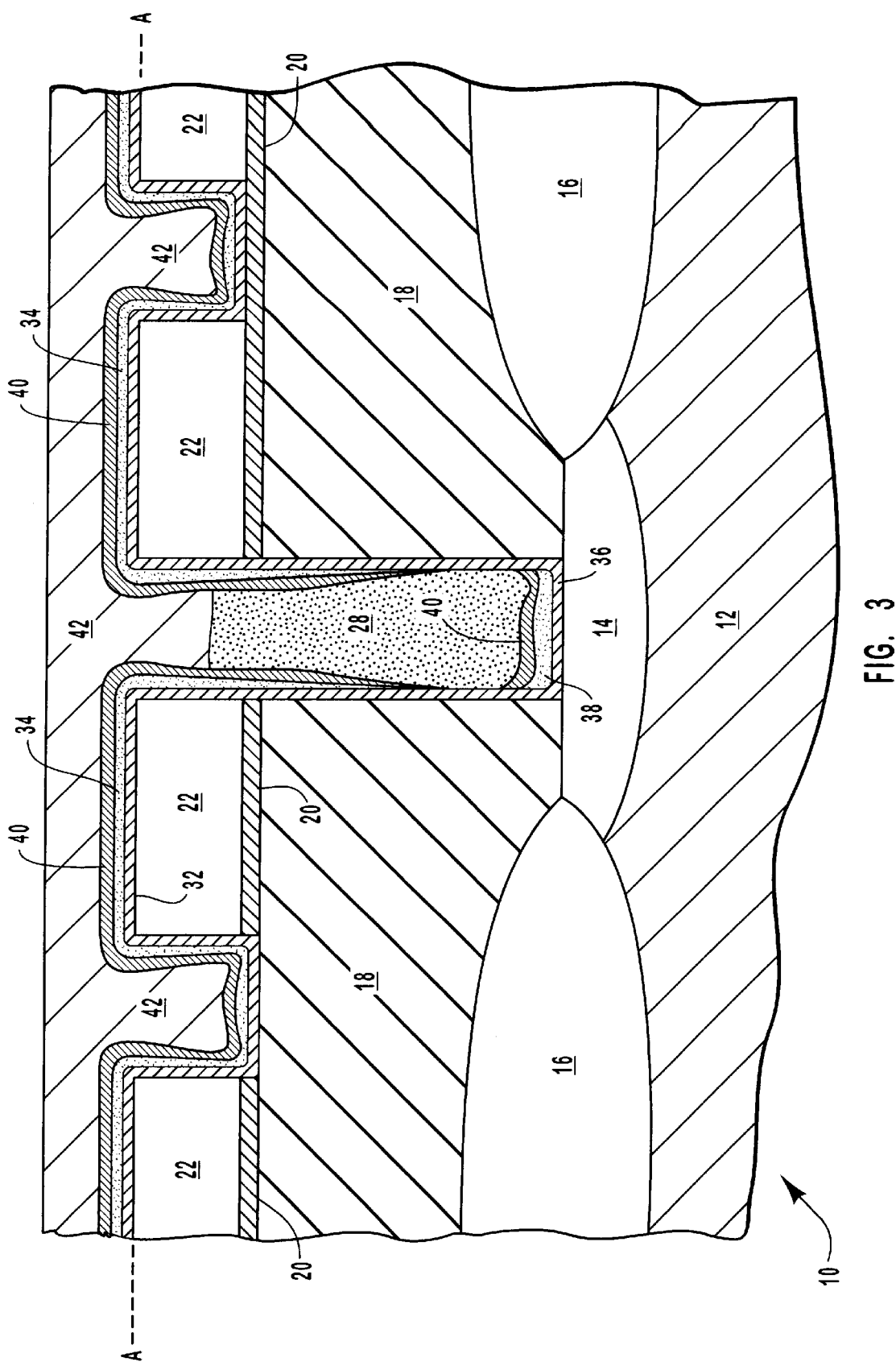
FIG. 3 is a view of the semiconductor structure depicted in FIG. 2 after further processing, including RTA in order to form a cobalt-diffused cobalt silicide layer at the bottom of the contact corridor, a PVD TiN layer, formation of a thermal TiN layer between the titanium layer and the PVD/TiN layer, followed by PVD of an aluminum layer that bridges over the trenches and the contact corridor.

Following deposition of cobalt layer 34, a thermal process that uses a nitrogen atmosphere is carried out, preferably by RTA, the results of which are depicted in FIG. 3. At the bottom of contact corridor 28, RTA has caused cobalt layer 34 to diffuse through titanium layer 32 and to combine with silicon in active area 14 of semiconductor substrate 12 to form a cobalt silicide layer 36. Optionally, any titanium from titanium layer 32 that has not diffused may form a thermal titanium nitride layer 38. Further processing comprises deposition of a titanium nitride layer 40 preferably by PVD. A PVD of a metallization such as an aluminum layer 42 follows as illustrated in FIG. 3 by hot and fast deposition to form a bridge-like structure over the top of semiconductor structure 10 that bridges over first trench 24, second trench 26, third trench 30, and contact corridor 28.

A pressure fill follows wherein aluminum layer 42 is forced to the bottom and substantially fills trenches 24, 30, contact corridor 28, and second trench 26. Finally, CMP is carried out to remove all material above the level indicated by dashed line A—A as seen in FIG. 3.

In a preferred alternative of this first embodiment, semiconductor structure 10 as illustrated in FIG. 1 is subjected to a 30 second 100:1 HF dip followed by a CVD of titanium layer 32. Titanium layer 32 is selected to be of a thickness that is sufficient to consume any native oxide formed upon the exposed portion of active area 14 that is on the bottom of contact corridor 28, but not so thick so as to substantially hinder diffusion of cobalt layer 34 therethrough. For example, if about 25 Å of native oxide were present at the portion of active area 14 exposed by contact corridor 28, a minimum of about 25 Å of titanium layer 32 would be preferred. In general, titanium layer 32 is selected to be in the thickness range of from 20 to 200 Å, preferably 30 to 150 Å, and most preferably 40 to 100 Å.

Following formation of titanium layer 32, cobalt layer 34 is formed preferably by sputtering. Because it is preferred that cobalt layer 34 substantially cover the bottom of contact corridor 28, directional sputtering of some type, for example, collimated or some other directional sputtering is preferred. Cobalt layer 34 is preferably about 800 Å thick when titanium layer 32 is 100 Å thick. Deposition of cobalt layer 34 can be accomplished by a 2.5:1 collimated cobalt sputtering.

FIG. 3 illustrates the results of the next technique used in the preferred alternative of the first embodiment, wherein an RTA is carried out to form cobalt silicide layer 36 and thermal titanium nitride layer 38. RTA conditions are selected in the time range of from about 10 to about 60 seconds, and in the temperature range of from about 200 to about 800° C. Following RTA, a titanium nitride layer 40 is deposited by PVD. Deposited titanium nitride layer 40 is selected in the thickness range from 500 to about 3,000 Å, preferably about 1,000 to about 2,500 Å, and most preferably from about 1,500 to about 2,000 Å. Following formation of deposited titanium nitride layer 40, a fast deposition by PVD of aluminum or an aluminum alloy is carried out. Preferably the conditions of the fast deposition comprise about 12 kW to achieve the fast PVD of aluminum layer 42. Aluminum layer 42 is then pressure filled under processing conditions of a pressure range from about 600 to about 800 atm, and preferably from about 700 to about 750 atm. The temperature range is from about 400° C. to about 550° C., and preferably from about 480 to about 520° C. The preferred process duration is in the range of from about one to about four minutes. Following pressure filling, remnants of aluminum layer 42 that are situated above first dielectric 22 are removed, for example, by CMP as illustrated by dashed line A—A in FIG. 4.

Aluminum layer 42 may be deposited and filled by other techniques. Depending upon the specific application, other aluminum filling techniques such as hot aluminum reflow, directional sputtering, or low pressure CVD combined with reflow may be selected.

Figure 4:
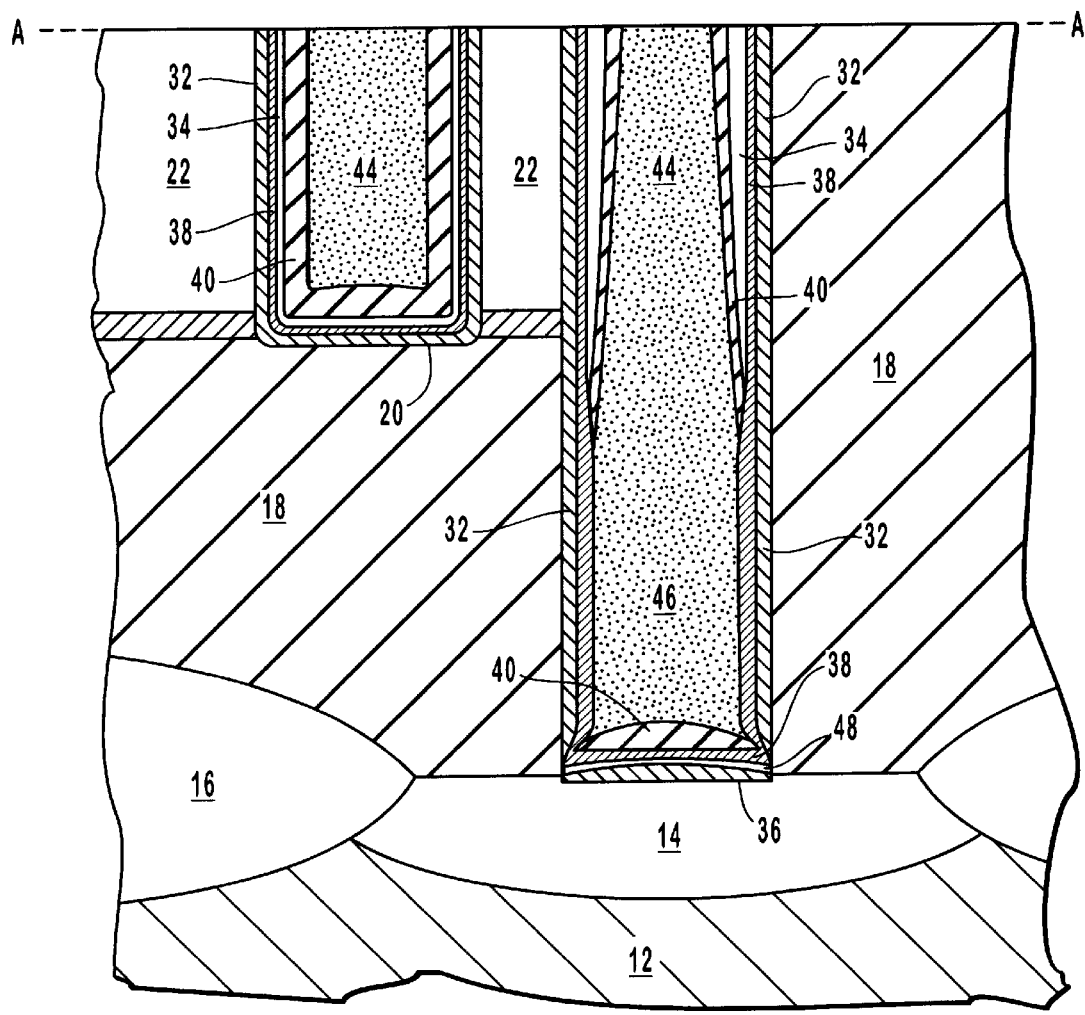
FIG. 4 illustrates further processing of the semiconductor structure depicted in FIG. 3, wherein the PVD aluminum layer has been pressure filled, and all material that was not filled into either the trenches or the contact corridor has been removed by CMP, wherein a cobalt silicide layer is optionally superposed with a substantially pure titanium layer, a thermal TiN layer that is superposed thereon, and a stoichiometric TiN layer that is superposed thereon at the bottom of the contact corridor, and a volume of aluminum is shown that occupies the balance of the contact corridor.

FIG. 4 shows, depending upon the preferred application of the inventive method, the structure at the bottom of contact corridor 28 which comprise cobalt silicide layer 36 that may be covered with an optional unreacted titanium layer 48. By selecting processing conditions, unreacted titanium layer 48 may be entirely consumed into a thermal titanium nitride such as thermal titanium nitride layer 38. Thermal titanium nitride layer 38 is covered with deposited titanium nitride layer 40. Titanium nitride layers 38, 40 may be fabricated such that no discrete boundary separates the two. For example, at the bottom of thermal titanium nitride layer 38, a mix of titanium and nitride may comprise a ratio of, for example, 75:25 in favor of titanium, preferably 60:40, and most preferably 55:45. A composition gradient is then achieved between the bottom of thermal titanium nitride layer 38 and the top of deposited titanium nitride layer 40 such that the top of deposited titanium nitride layer 40 is comprised of a preferred stoichiometric ratio of titanium to nitrogen, i.e. 50:50.

It is preferred that, preceding deposition of aluminum layer 42, the composite of titanium layer 32, cobalt layer 34, thermal titanium nitride layer 38, and deposited titanium nitride layer 40 form a continuous covering over semiconductor structure 10.

Because aluminum and its alloys are substantially insoluble in titanium nitride, pressure filling is facilitated such that aluminum layer 42 will flow across the outer surfaces of the aforementioned layers without substantially intermingling. Thermal titanium nitride layer 38 is likely an equiaxied structure or an amorphous structure and deposited titanium nitride layer 40 is likely columnar. Deposited titanium nitride layer 40 is preferred next to aluminum layer 42 that subsequently forms filled aluminum trench 44 and a filled aluminum contact 46 as illustrated in FIG. 4.

PVD titanium nitride also has a lower resistivity than thermally formed titanium nitride. The resistivity of PVD titanium nitride will be less than 100 $\mu\Omega$-cm. Thermal titanium nitride layer 38 will have a resistivity in the range of about 1,000 $\mu\Omega$-cm, therefore, it is preferred that formation of thermal titanium nitride layer 38 be conventionally minimized as is within the skill of the routineer in the art.

In subsequent illustrated embodiments including FIGS. 5A–9B, processing steps such as those illustrated in FIGS.

1–4 are presumed. For example, items such as trenches 24, 26, 30, contact corridor 28, and aluminum layer 42 as illustrated in FIGS. 1–4 are referenced to facilitate discussion of the preferred embodiments, but they are not necessarily depicted. For example, in FIGS. 5A–9B, a single trench is depicted without a contact corridor beneath it and a dual damascene trench and contact corridor is depicted. It is understood that when trenches 24, 30 are referred to, the single trench is meant thereby.

In a second embodiment, a disappearing mobility underlayer is deposited into the trench or contact corridor. This inventive method embodiment comprises surface pre3 cleaning as set forth above, CVD of titanium, CVD of titanium nitride, RTA, CVD of germanium followed by PVD of a metallization layer, pressure filling, and CMP.

In a preferred alternative of the second embodiment, semiconductor structure 10 is dipped in 100:1 HF for about 30 seconds. Following the HF dip, titanium layer 32 is deposited in a thickness range of from about 50 to about 400 Å, more preferably from about 100 to about 300 Å, and most preferably to about 200 Å. In place of using cobalt layer 34, titanium nitride layer 40 is formed by CVD in a thickness range of from about 100 to about 500 Å, more preferably from about 200 to about 400 Å, and most preferably about 300 Å. Following deposition of titanium nitride layer 40, RTA is carried out in which a titanium silicide layer 54 forms at the bottom of contact corridor 28 upon active area 14. RTA conditions are selected in the time range of from about 10 to about 60 seconds, and in the temperature range of from about 200 to about 800° C. The metallurgical junction that forms during the RTA comprises active area 14 and titanium silicide layer 54. Unlike cobalt silicide, titanium silicide is not as resistant to reactive encroachment of aluminum layer 42 into active area 14. As such, RTA conditions must be monitored with vigilance if a shallow junction is being fabricated.

Following RTA, a disappearing underlayer of germanium is deposited by CVD. The thickness range of the disappearing germanium layer is from about 50 to 500 Å, preferably about 100 to about 400 Å, and most preferably about 200 to about 300 Å. The morphology of the disappearing germanium underlayer can be selected to be either amorphous or polycrystalline. Control of the morphology is dictated by RTA conditions and by CVD conditions.

Following deposition of the disappearing germanium underlayer, aluminum layer 42 is deposited by PVD under conditions of about 12 kW. Pressure filling conditions are from about 700 to about 750 atm, from about 300 to about 520° C., and from about 1 to about 4 minutes.

FIGS. 5A and 5B illustrate the result of a preferred alternative of the second embodiment. FIG. 5A illustrates a structure within a trench. It can be seen that thermal titanium nitride layer 38 has also formed by diffusion of nitrogen during the RTA through titanium nitride layer 40 and by using the titanium in titanium layer 32 as a co-reactant with the RTA nitrogen atmosphere.

FIG. 5B illustrates the structure at the bottom of contact corridor 28, where the formation of titanium silicide layer 54 has occurred upon active area 14 of semiconductor substrate 12. Similar to the multi-layer structure illustrated in FIG. 4, in the second embodiment a multi-layer structure at the bottom of contact corridor 28 may also be present. The multi-layer structure may include the following layers: a silicon layer comprising active area 14, titanium silicide layer 54, unreacted remnants of titanium layer 32 (not pictured), thermal titanium nitride layer 38 (not pictured), titanium nitride layer 40, a germanium aluminide layer (not pictured), and filled aluminum contact 46. The multi-layer structure as set forth above is achievable by selection of preferred layer thicknesses, RTA, and pressure filling conditions. It can be seen in FIGS. 5A and 5B that germanium has substantially disappeared as a discreet component of semiconductor structure 10. There remain, however, germanium aluminide regions 52 that have formed and/or migrated from the position where germanium originally was deposited.

Germanium lowers the melting point of aluminum. Because of the lower temperatures required during pressure filling made possible by the presence of germanium next to aluminum layer 42, the second embodiment maximizes aluminum flowability, reduces temperature and time requirements to achieve aluminum flow, and maximizes the robustness of the liners against aluminum diffusion due to the continuous nature of the reacted layers.

In a third embodiment, a disappearing mobility underlayer of silicon is deposited into a depression. The third embodiment comprises surface pre-cleaning as set forth above, CVD of titanium, PVD of cobalt, RTA, CVD of silicon, followed by PVD of aluminum, pressure filling, and CMP. The third embodiment includes the disappearing mobility underlayer technique set forth above to form shallow junctions and high aspect-ratio contacts.

In a preferred alternative of this third embodiment seen in FIG. 6A, semiconductor structure 10 is dipped in a solution of 100:1 HF for about 30 seconds. Following the HF dip, titanium layer 32 is deposited by CVD in a thickness range of from about 50 to about 400 Å, more preferably from about 75 to about 300 Å, and most preferably at a thickness of about 100 Å. Cobalt layer 34 is deposited by PVD similar to that in the first embodiment as set forth above. A collimation ratio of 2.5:1 is preferred. Collimation deposition of cobalt layer 34 in a thickness range from about 400 to about 1,200ÅA, preferably 600 to about 1,000 Å, and most preferably about 800 Å.

Similar to the first embodiment, semiconductor structure 10 fabricated thus far is subject to RTA, which accomplishes diffusion of deposited cobalt layer 34 through titanium layer 32 at the bottom of contact corridor 28 so as to form cobalt silicide layer 36.

In the third embodiment, a disappearing silicon underlayer is deposited by CVD. A preferred thickness of the CVD silicon underlayer is from about 100 to about 300 Å, and more preferably about 200 Å. The CVD silicon underlayer is a disappearing mobility underlayer analogous to the CVD germanium layer as set forth in the second embodiment.

Silicon, like germanium lowers the eutectic point, diffuses into the aluminum metallization, and lowers the melting point of the aluminum that it is in contact therewith. This lowering of the melting point facilitates a lower friction in the flow of the aluminum against the sidewalls of the depression during pressure filling or reflow. Use of silicon in this embodiment has the advantage of assisting in high aspect ratio contact formation and for formation of shallow junction structures. The contact and shallow junctions are formed separately or together where, in concert with cobalt that has diffused through the titanium to form cobalt silicide layer 36, high aspect ratios and shallow junctions are formed simultaneously.

Following formation of a CVD silicon underlayer as set forth above, one may elect to subject semiconductor structure 10 to a second HF dip, such as a 30 second 100:1 HF treatment. Following the optional HF dip, the method of PVD of aluminum layer 42, pressure filling, and CMP are carried out in substantially the same manner as set forth in the second embodiment.

FIG. 6B illustrates the structure accomplished by the third embodiment where cobalt silicide layer 36 has formed at the bottom of contact corridor 28. Within cobalt silicide layer 36 there may be additionally an upper portion of cobalt silicide layer 36 that comprises substantially pure cobalt (not shown). Achieving a cobalt silicide layer that transitions to substantially pure cobalt can be done by control of the RTA process. The advantage for a cobalt silicide layer that transitions to substantially pure cobalt depends upon the specific application. For example, depending upon the thermal conductivity of dielectric materials that neighbor cobalt silicide layer 36 as well as the thermal conductivity of active area 14, a substantially continuous transition from cobalt silicide to substantially pure cobalt can minimize creep failure caused during fabrication heating or during field-use heating. It is within the realm of routine experimentation of one of ordinary skill in the art to select dielectric materials and a specific gradation between stoichiometric cobalt silicide and substantially pure cobalt by reading the specification and/or by practicing the invention.

It can also be seen in FIGS. 6A and 6B at the top of both trench 24, 30 and contact corridor 28 that thermal titanium nitride layer 38 has formed by diffusion of nitrogen through cobalt layer 34 used in the RTA. It can also be seen in that aluminum silicide regions 60 may be left as a residual.

In fourth and fifth embodiments, the inventive method of the third embodiment is carried out including sequential operations of the third embodiment up to and including deposition of a disappearing silicon underlayer. In the fourth and fifth embodiments, deposition of a silicon underlayer is followed by a second RTA. A second RTA will cause, depending upon the duration and temperature of the treatment, at least some of the silicon and perhaps all thereof to dissolve into titanium layer 32. Because the silicon underlayer is calculated to assist in localized lowering of the melting point of aluminum layer 42 during pressure filling, in the fifth embodiment the second RTA is followed by CVD of a second silicon underlayer to restore sufficient silicon within trenches 24, 30 and contact corridor 28 to facilitate flowability of aluminum layer 42.

Figure 7B:
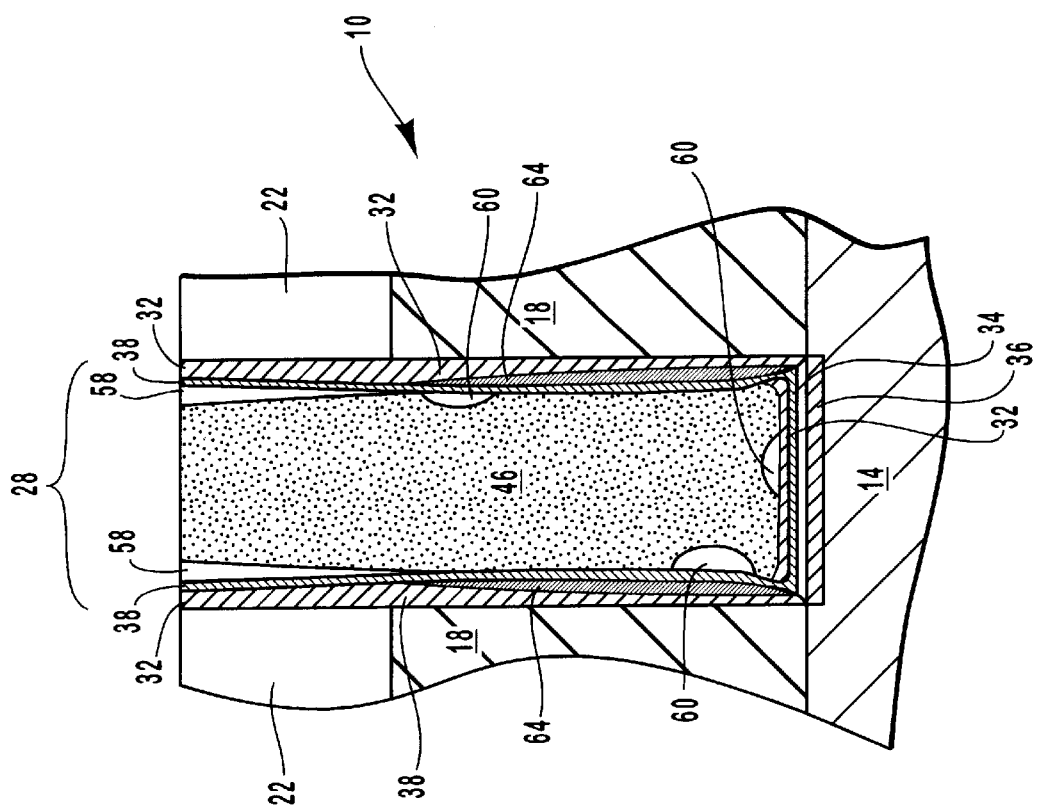
FIG. 7B illustrates a detail section of a filled contact corridor, wherein a diffused cobalt silicide layer has been formed upon the active area of a semiconductor substrate, a titanium layer substantially conformably lines the contact corridor wall, a reacted titanium nitride layer substantially conformably lines the titanium layer, wherein metallization has filled the contact corridor, and wherein there are optional aluminum silicide regions.
Figure 7A:
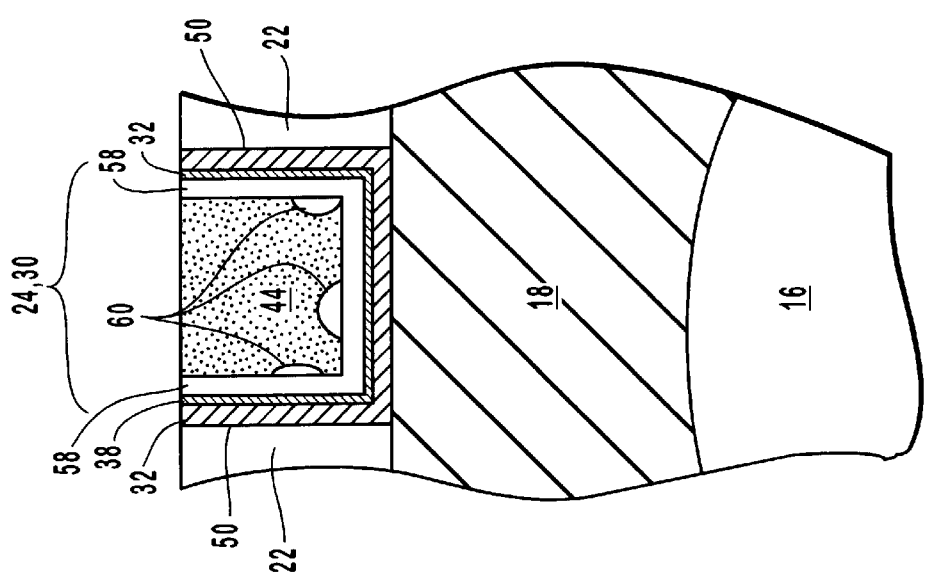
FIG. 7A illustrates a detail of a filled trench achieved by the process of the fourth embodiment, wherein a titanium layer substantially conformably lines the trench, a reacted titanium nitride layer substantially conformably lines the titanium layer, a cobalt silicide layer substantially conformably lines the reacted titanium nitride layer, wherein aluminum or aluminum alloy metallization substantially fills the trench, and wherein there are optional regions of aluminum silicide.

FIGS. 7A and 7B illustrate the structure as accomplished by the methods of the fourth and fifth embodiments. It can be seen in FIG. 7B that at the bottom of contact corridor 28 cobalt silicide layer 36 has formed by diffusion of cobalt layer 34 through titanium layer 32. Cobalt that has diffused, but not reacted may also be present as a diffused cobalt layer 34. Because of the presence of silicon in the fourth and fifth embodiments within the walls of contact corridor 28, formation of a titanium silicide layer 64 also will occur. In the first RTA of the fourth and fifth embodiments, thermal titanium nitride layer 38 will also form, however, the thickness thereof will be on about the order of about 50 Å or lower.

It can also be seen in FIG. 7A that a vertical cobalt silicide layer 58 has formed due to the second RTA that is done subsequent to deposition of a silicon layer. It can be seen that titanium silicide layer 64 forms just below the bottom of vertical cobalt silicide layer 58. Thus, silicon that was formed by CVD forms either cobalt silicide layer 58 in the trenches and near the top of contact corridor 28, or it forms titanium silicide layer 64 therebelow. FIG. 7A also illustrates the formation of residual aluminum silicide region 60.

Vertical cobalt silicide layer 58 may include varying concentrations of cobalt silicide. The varying concentrations of cobalt silicide may also include pure cobalt next to thermal titanium nitride layer 38, and a concentration gradient of silicon-lean cobalt silicide may progress from optionally pure cobalt to a silicon-rich cobalt silicide. Thus, vertical cobalt silicide layer 58 may comprise at least three discernable regions of stoichiometric cobalt silicide, silicon-lean cobalt silicide, and substantially pure cobalt.

It can be seen in FIG. 7B, due to a high aspect-ratio of contact corridor 28, that cobalt deposition occurs by PVD at the bottom of contact corridor 28 and at the top thereof. However, sidewall coverage of cobalt within contact corridor 28 tapers down to substantially no coverage as illustrated by vertical cobalt silicide layer 58 that has been converted from substantially pure cobalt to cobalt silicide by the method of the fourth and fifth embodiments.

At the bottom of contact corridor 28 it can be seen that a multi-layer structure can be formed. For example, active area 14 is covered by cobalt silicide layer 36, cobalt silicide layer 36 is covered by an optional unreacted cobalt layer 34, cobalt layer 34 is covered by an optional unreacted titanium layer 32, and titanium layer 32 is covered by thermal titanium nitride layer 38. Along sidewalls 50 below the occurrence of vertical cobalt silicide layer 58, titanium layer 32 may transform from a substantially pure titanium to titanium plus titanium silicide layer 64 due to the effect of the second RTA following deposition of the disappearing silicon underlayer.

One quality of the fourth and fifth embodiments is that aluminum can be force-filled into high aspect ratio contact corridors under lower temperatures that economize the thermal budget of a fabrication process. A structure achieved by the fourth and fifth embodiments is formation of shallow junctions as previously defined. This structure is achieved by minimizing silicon consumption at the bottom of contact corridor 28 upon active area 14 due to the presence of cobalt silicide layer 36 which acts as an aluminum diffusion barrier.

In sixth and seventh embodiments, titanium and cobalt layer formation are followed by a first RTA and by CVD of formation of a disappearing germanium underlayer. PVD formation of an aluminum metallization layer, pressure filling, and CMP follow. The sixth embodiment comprises a single germanium underlayer deposition. In the seventh embodiment, a second RTA follows the germanium underlayer deposition and an optional second germanium underlayer deposition is carried out where, according to a specific application, the second RTA has substantially consumed all germanium and more germanium is needed to cause localized melting point lowering to facilitate flowability of the aluminum metallization. Germanium aluminide regions may form within the depression depending upon the process parameters.

Figure 8B:
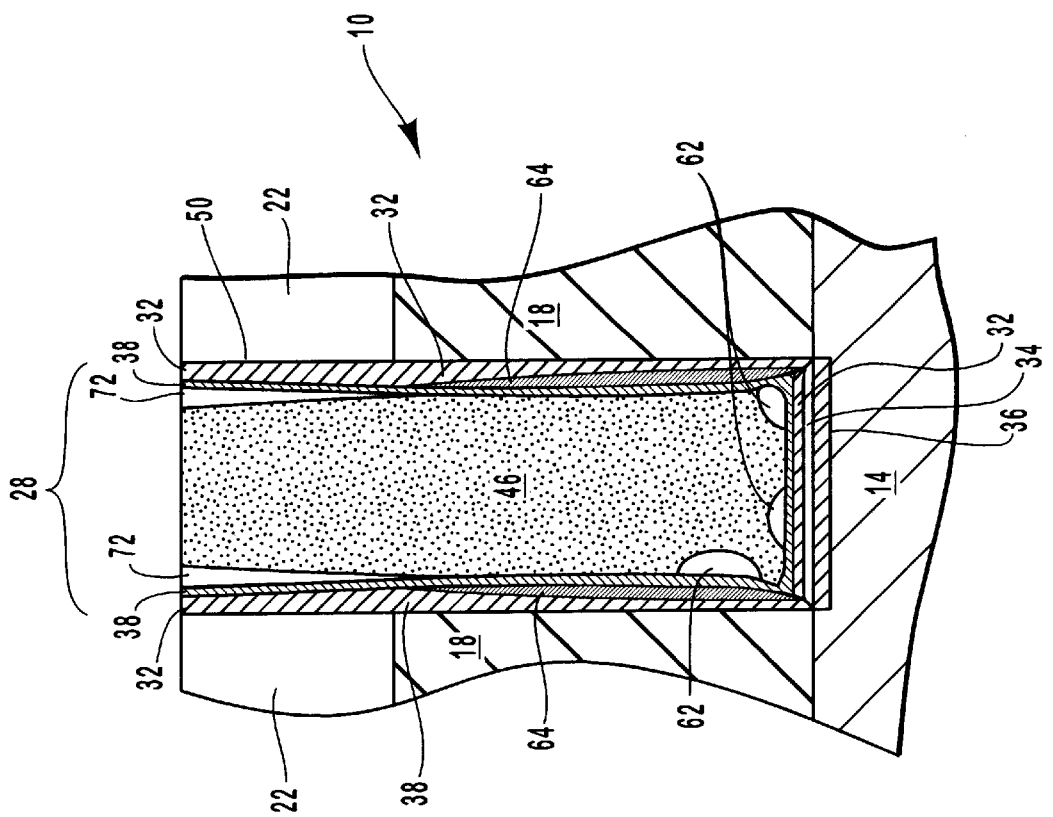
FIG. 8B illustrates a detail section of a filled contact corridor wherein a diffused cobalt silicide layer has formed upon the active area of a semiconductor substrate, a titanium layer substantially conformably lines the bottom of the contact corridor, a reacted titanium nitride layer lines the titanium layer, metallization substantially fills the contact corridor, and wherein there are optional regions of aluminum germanide.
Figure 8A:
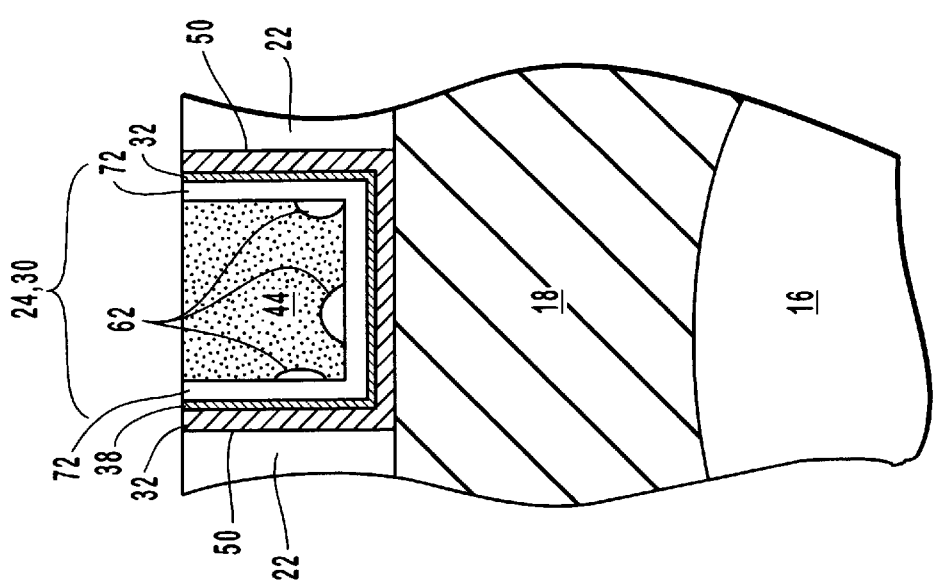
FIG. 8A illustrates a detail of a filled trench achieved according to the sixth embodiment, wherein the trench is lined substantially conformably with a titanium layer, a reacted titanium nitride layer lines the titanium layer, a cobalt germanide layer lines the reacted titanium nitride layer, aluminum metallization substantially fills the trench, and wherein there are optional regions of aluminum germanide.

FIGS. 8A and 8B illustrate the structure achieved by the sixth and seventh embodiments. In FIGS. 8A and 8B it can be seen that the achieved structure of the sixth and seventh embodiments includes cobalt silicide layer 36 at the bottom of contact corridor 28 that assists in formation of a shallow junction by resisting aluminum diffusion and encroachment into active area 14. It can also be seen that germanium aluminide regions 62 are formed depending upon the process parameters. Filled trench 44 includes aluminum metallization formed from aluminum layer 42. Optional regions of cobalt germanide 62 are formed from cobalt layer 34 and deposition of the germanium layer as set forth above. Thermal titanium nitride layer 38 is formed by diffusion of nitrogen during RTA in a nitrogen atmosphere in combination with titanium layer 32.

In the bottom of contact corridor 28 it can be seen that a structure has been formed that is similar to that within trench 24, illustrated in FIG. 8A, with the exception of the absence of a vertical cobalt germanide layer 72 due to the lack of deposition at the bottom of contact corridor 28 upon vertical surfaces because of PVD techniques. The structure at the bottom of contact corridor 28 may include at least five distinct layers. Active area 14 is covered by cobalt silicide layer 36, and cobalt silicide layer 36 may be covered by unreacted cobalt layer 34 that has diffused through titanium layer 32. Above cobalt layer 34, if cobalt layer 34 is present, there may be titanium layer 32. Depending upon the duration and temperature of the RTA, thermal titanium nitride layer 38 may cover titanium layer 32. Thermal titanium nitride layer 38 may entirely consume titanium layer 32 at the bottom of contact corridor 28. Filled aluminum contact 46 can be seen wherein germanium aluminide regions 62 are also formed depending upon the process parameters and the specific application required by employing the inventive method.

In an eighth embodiment, a disappearing mobility underlayer of silicon is deposited into the depression. The eighth embodiment comprises surface pre-cleaning as set forth above, CVD of titanium, CVD of a silicon underlayer, RTA, CVD of a disappearing germanium mobility underlayer, followed by aluminum deposition, pressure filling, and CMP.

In a preferred alternative of this eighth embodiment, semiconductor structure 10 is dipped in a solution of 100:1 HF for about thirty seconds. Titanium layer 32 is deposited by CVD at a thickness range from about 50 to about 200 Å, preferably about 75 to about 150 Å, and most preferably about 100 Å. The silicon underlayer has a thickness range from about 50 to 500 Å, and preferably about 200 Å. RTA of the silicon underlayer and titanium layer 32 is carried out under conditions optimized to form titanium silicide on active area 14 of semiconductor substrate 12 and a continuous titanium silicide layer 64 on the sidewalls of both contact corridor 28 and trenches 24, 30.

Following RTA, a disappearing germanium underlayer is formed by CVD in a thickness range from about 50 to about 400 Å, preferably about 100 to about 300 Å, and most preferably about 200 Å. The germanium underlayer facilitates maximum aluminum flowability for aluminum layer 42, reduces temperature and time requirements to achieve movement of aluminum layer 42, minimizes consumption of silicon in active area 14 due to the presence of germanium, and maximizes the robustness of the liner within the depression against aluminum diffusion due to the continuous nature of reacted layers. The conditions of fast deposition of aluminum layer 42, pressure filling, and CMP are set forth above and/or are discernable, depending upon the specific application being used by the fabricator, by reading the specification or practicing the invention.

FIGS. 9A and 9B illustrate the structure achieved by the eighth embodiment. It can be seen in FIG. 9A for trench formation that a substantially conformable titanium silicide layer 64 has formed within trenches 24, 30. The effects of the RTA process achieves thermal titanium nitride layer 38, that depending upon the specific application, will be in a thickness range from about 10 to about 50 Å, preferably from about 20 to about 40 Å, and most preferably less than 25 Å. Within filled trench 44 it can be seen that formation of regions of aluminum silicide 60 and germanium aluminide 62 have occurred.

Titanium silicide layer 64 may comprise at least three distinct regions. For example, titanium silicide layer 64 against sidewall 50 may comprise a substantially pure remnant of titanium layer 32. A substantially pure remnant of titanium layer 32 will occur where RTA conditions cause incomplete silicidation of titanium layer 32. Titanium silicide layer 64 would then comprise, against sidewall 50, a substantially pure titanium region, a silicon-lean titanium silicide region, and a stoichiometrically balanced titanium silicide layer. The presence of regions 60, 62 or the complete disappearance thereof depends upon the temperature and duration of the thermal processing.

In a ninth embodiment, a disappearing germanium mobility underlayer is used for back-end-of-line (BEOL) wiring for a trench and/or a via. The ninth embodiment is preferred for via filling where processing temperatures are held below those required to form silicides. FIGS. 10A through 10D illustrate the structure achieved by the ninth embodiment. Semiconductor structure 10 is subjected to a surface pre-clean as set forth above, for example, by use of a dip in a solution of 100:1 HF. Unlike all previously described embodiments, titanium is deposited by PVD. FIGS. 10C and 10D depict structures achieved by the ninth embodiment as interconnects that are made with a metal line 66 by connection with a filled aluminum contact interconnect 76. Following formation of PVD titanium layer 68, a disappearing germanium underlayer is formed either by PVD or CVD.

Figure 10A:
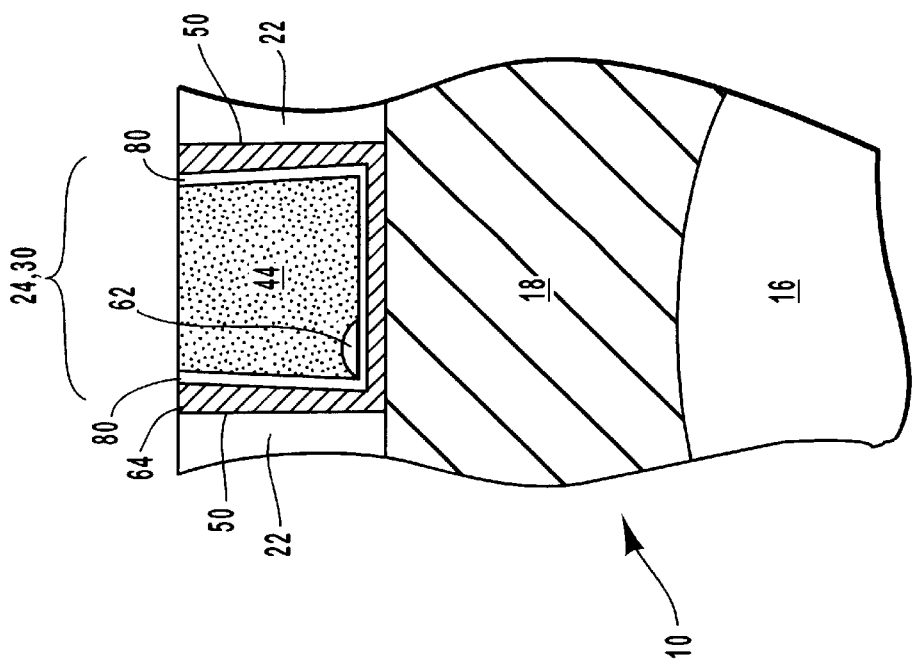
FIG. 10A illustrates a detail of a trench structure achieved according to a first preferred alternative of the ninth embodiment, wherein PVD formation of a titanium layer and a germanium layer and subsequent processing has formed a substantially conformable titanium layer lining the trench, a reacted titanium aluminide layer substantially conformably lines the titanium layer, metallization substantially fills the trench, and there are optional regions of germanium aluminide that occur particularly at the bottom of the trench.
Figure 10B:
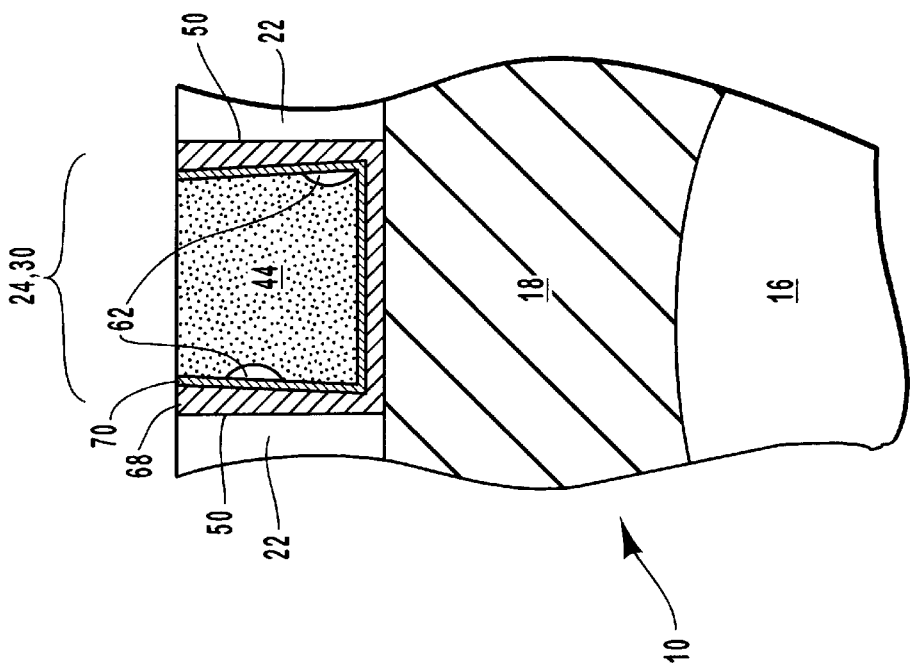
FIG. 10B illustrates a detail of a trench structure achieved according to a second preferred alternative of the ninth embodiment, wherein PVD formation of a titanium layer and a germanium layer has formed a structure comprising a titanium layer that substantially conformably lines the trench, a reacted titanium germanide layer substantially conformably lines the titanium layer, metallization substantially fills the trench, and wherein there are optional regions of germanium aluminide.
Figure 10C:
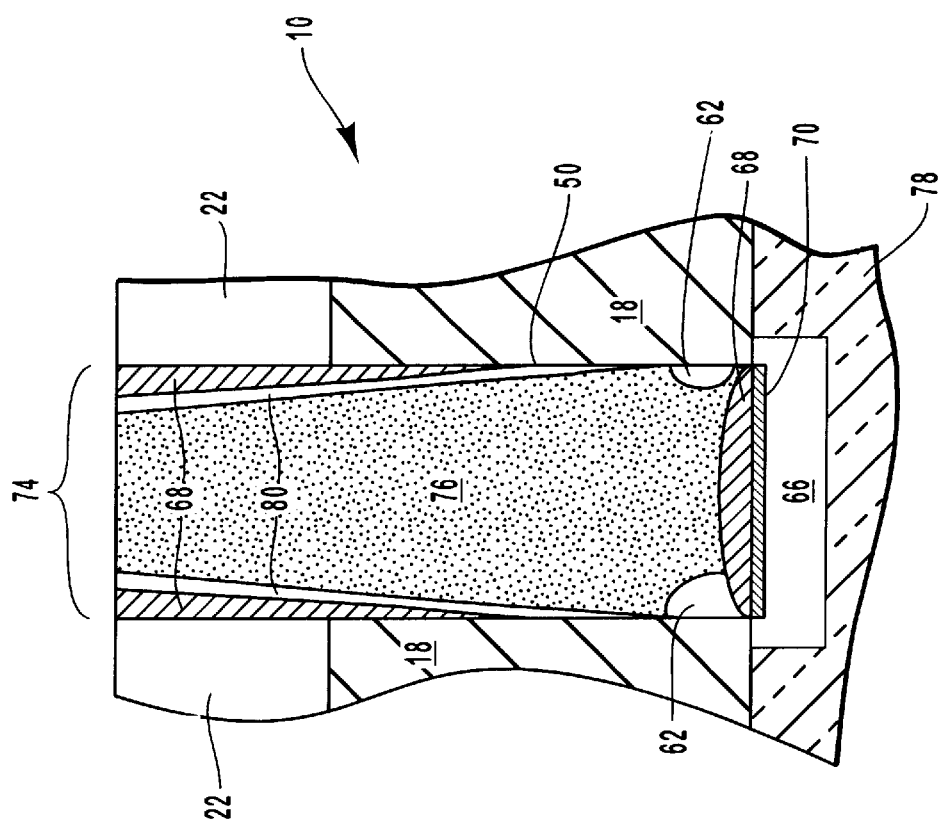
FIG. 10C illustrates a detail section of a filled contact corridor for the first preferred alternative of the ninth embodiment, wherein a reacted titanium aluminide layer has formed at the bottom of the contact corridor upon an interlevel metallization line, the contact corridor is partially lined with a titanium layer and a reacted titanium aluminide layer, the contact corridor is substantially filled with metallization, and there are optional regions of germanium aluminide.
Figure 10D:
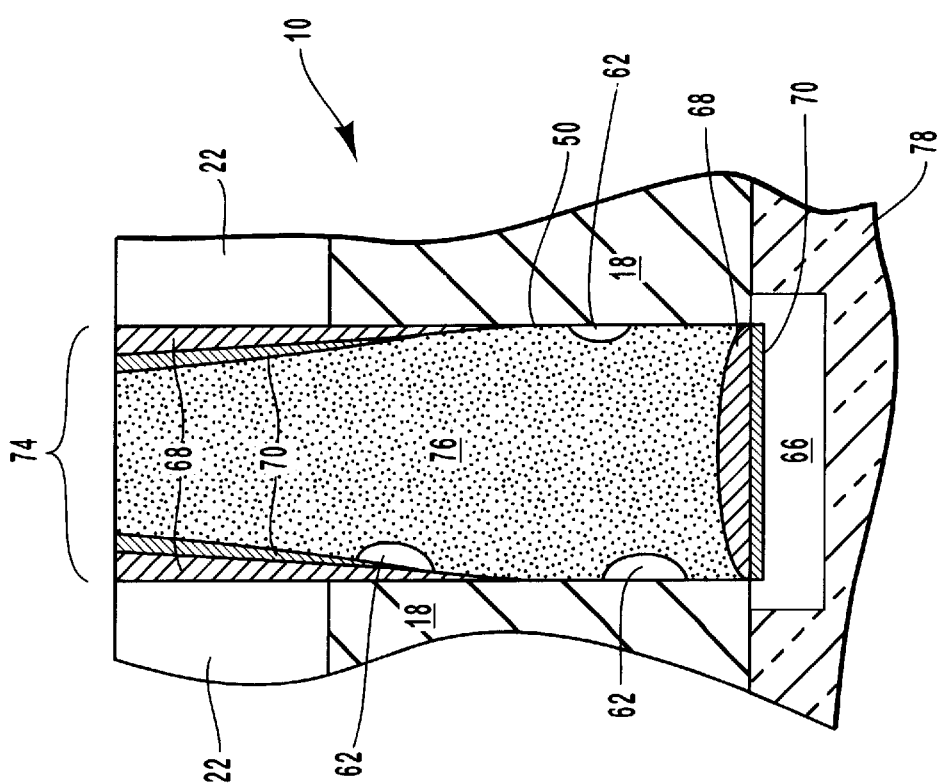
FIG. 10D illustrates a detail section of a filled contact corridor for the second preferred alternative of the ninth embodiment, wherein a germanium layer was formed by PVD such that sidewall deposition of germanium was achieved near the bottom of the contact corridor, a reacted titanium aluminide layer is formed upon an interlevel metallization line, wherein a deposited titanium layer lines part of the contact corridor, a reacted titanium germanide layer lines the titanium layer, metallization substantially fills the contact corridor, and there are optional regions of germanium aluminide.

Aluminum layer 42 is next deposited by one of two processes. A first alternative process comprises a two-step cold/hot combination deposit of aluminum layer 42 by PVD. Process parameters for the first alternative process include deposition energy in the range from about 1 kW to about 16 kW. The temperature of the cold deposition is in a temperature range from about 0° C. to about 250° C. Energy and temperature conditions for the hot deposition portion include from about 1 kW to about 8 kW and from about 250° C. to about 660° C. A second alternative deposition process for aluminum layer 42 comprises a slow/warm deposition process. The maximum temperature to be achieved in forming aluminum layer 42 is in the range from about 250° C. to about 450° C.

Where both titanium layer 68 and the disappearing germanium layer are formed by PVD, sidewall coating will be minimal as the aspect ratio increases for trenches 24, 30, and contact corridor 28 as illustrated in FIGS. 10A and 10C. Therefore, a PVD of both titanium layer 68 and the disappearing germanium underlayer is not preferred for high aspect ratio interconnects. Where titanium layer 68 is deposited by PVD, it is preferred that the disappearing germanium underlayer is deposited by a low-temperature CVD process, whereby sidewalls 50 will be substantially coated with germanium.

Where metal line 66 lies at the bottom of a depression that is a via that has an aspect ratio of up to about two, double PVD formation of titanium layer 68 and the disappearing germanium layer may be suitable to form an interconnect. Pressure filling of aluminum layer 42 into trenches 24, 30, and via 74 is carried out in a temperature range of from about 250° to about 450° C. and pressures from about 500 to about 1,200 atm.

Formation of filled aluminum trench 44 and a filled aluminum interconnect 76, as illustrated in FIGS. 10A through 10D, show that virtually no germanium is left in it's as-deposited state. Titanium layer 68 lies substantially conformably within trench 24, 30, and via 74 and when PVD is used to form a disappearing germanium underlayer, as illustrated in FIGS. 10A and 10C, it can be seen that virtually no germanium in chemical combination is seen upon sidewalls 50 of either trench 24, 30 or via 76. On the other hand, germanium can be seen in FIGS. 10B and 10D as having been combined with titanium and/or aluminum to form a titanium germanide layer 80 or germanium aluminide layer 62 within the sidewall due to the more omni-directional deposition characteristic of CVD. At the bottom of via 74, it can be seen that a titanium aluminide layer 70 has formed by a combination of metal line 66 and titanium layer 68. Optional regions of germanium aluminide 62 are also seen throughout the structures as achieved.

The ninth embodiment is preferred for via formation and via filling where it is otherwise problematic to form interconnects due to the existence of destructive stressing at processing temperatures. For example, where metal line 66 would be subjected to destructive stressing at processing temperatures above about 450° C., the ninth embodiment is preferred. The ninth embodiment is also preferred for processing with optional specialized dielectrics 78 that are sensitive to temperatures above about 450° C. Such dielectrics may for example have a dielectric constant lower than BPSG, $Si_3N_4$, or TEOS, but may be subject to decomposition and destruction of its required properties at temperatures above 450° C. Dielectric 78 may, however, be TEOS, BPSG, or $Si_3N_4$.

In a tenth embodiment, as depicted in FIGS. 5A and 5B, the method of the second embodiment is repeated including formation of a disappearing germanium underlayer. In the tenth embodiment, the technique of driving substantially all germanium out of the metallurgy is carried out after filling aluminum layer 42 into trenches 24, 26, 30, and contact corridor 28. Also, an additional anneal is carried out following pressure filling, whereby substantially all germanium is removed by causing regions of germanium aluminide 62 to migrate to a position in semiconductor structure 10 that will ultimately be removed by CMP. The tenth embodiment may also be applied as a late process step to any of the second through ninth embodiments and their preferred alternatives.

In a preferred alternative of the tenth embodiment, semiconductor structure 10 is immersed in a solution of 100:1 HF for 30 seconds followed by formation of titanium layer 32 and titanium nitride layer 40. A first RTA is carried out whereby titanium silicide layer 54 forms at the intersection of active area 14 and contact corridor 28. A disappearing germanium mobility underlayer is then formed by CVD. The preferred thickness of the germanium underlayer is from about 100 to about 500 Å, preferably from about 200 to about 400 Å, and most preferably about 300 Å.

Semiconductor structure 10 may then re-subjected to a dip in a solution of 100:1 HF for about 30 seconds. Aluminum layer 42 is next formed by fast deposition of aluminum or an aluminum alloy at about 250° C. and at an energy of about 12 kW. Pressure filling of aluminum layer 42 is next carried out at conditions of pressure from about 700 to about 750 atm, at a temperature of about 520° C., for and a filling time in the range from about one minute to about four minutes depending upon the application. Further thermal processing is optionally carried out at this point, where alloying is carried out between the metallization of filled aluminum trench 44 or filled aluminum contact 46 with any residual germanium and titanium layer 32. It is desired in the tenth embodiment to remove substantially all regions of germanium aluminide for reasons of higher resistivity caused by their presence. Other reasons to remove substantially all regions of germanium aluminide include the existence of heat stress or creep failure characteristics caused by these germanium aluminide regions and because of fabrication device failures such as destructive shorting between neighboring structures.

The technique for removing substantially all germanium from semiconductor structure 10 is carried out by an alloying treatment such as thermal soaking at a temperature range from about 350 to about 500° C., and preferably about 400° C., which temperature range is to be maintained for a processing time from about 30 to about 120 minutes.

The tenth embodiment provides the advantage of supplying a germanium layer to facilitate mobility of aluminum layer 42 during pressure filling. Thereafter, germanium is substantially removed from semiconductor structure 10. Where the thermal budget of the fabrication process has not been substantially spent or is not substantially required for subsequent processing, the method of annealing over a long duration such as up to about 120 minutes can be carried out.

The present invention may be embodied in other specific forms without departing from its spirit or essential characteristics. The described embodiments are to be considered in all respects only as illustrated and not restrictive. The scope of the invention is, therefore, indicated by the appended claims and their combination in whole or in part rather than by the foregoing description. All changes that come within the meaning and range of equivalency of the claims are to be embraced within their scope.

What is claimed and desired to be secured by United States Letters Patent is:

1. A method of forming an electrical connection comprising sequentially:
    forming a depression in a semiconductor structure, said depression being defined by at least one dielectric layer in said semiconductor structure;
    forming a titanium layer substantially conformably within said depression;
    forming a titanium nitride layer within said depression upon said titanium layer;
    diffusing nitrogen through at least a portion of said titanium nitride layer to react with said titanium layer so as to form titanium nitride;
    forming a first layer substantially conformably within said depression, said first layer being substantially composed of a material selected from the group consisting of germanium and silicon; and
    substantially filling said depression with an aluminum layer.

2. A method of forming an electrical connection according to claim 1, wherein said depression terminates at a silicon layer in said semiconductor structure, said silicon layer being exposed by forming said depression in said semiconductor structure, and wherein diffusing nitrogen through at least a portion of said titanium nitride layer further comprises forming titanium silicide with said exposed silicon layer.

3. A method of forming an electrical connection according to claim 2, wherein:
    said depression has an aspect ratio of about 8:1;
    said titanium layer has a thickness in a range from about 100 to about 300 Å;
    said titanium nitride layer has a thickness of about 300 Å;
    diffusing said nitrogen through at least a portion of said titanium nitride layer is conducted during RTA for a time range from about 10 to about 60 seconds at a temperature range from about 200 to about 800° C.;

said depression is substantially filled with said aluminum layer by PVD at an energy rate not greater than about 16 kW with an applied pressure to said aluminum layer in a pressure range from about 700 to about 750 atm at a temperature range from about 400° C. to about 550° C. for a time range from about one to about four minutes.

4. A method of forming an electrical connection according to claim 2, further comprising, following substantially filling said depression, removing substantially all material situated above said at least one dielectric layer.

5. A method of forming an electrical connection according to claim 2, wherein said first layer is substantially composed of germanium, said method further comprising, following substantially filling said depression:
   thermal processing said semiconductor structure, whereby said germanium migrates to a position situated above said at least one dielectric layer.

6. A method of forming an electrical connection according to claim 1, further comprising, following substantially filling said depression:
   removing substantially all material situated above said at least one dielectric layer.

7. A method of forming an electrical connection according to claim 6, wherein:
   said depression is a trench that extends through a first dielectric layer of said at least one dielectric layer and not extending through a second dielectric layer of said at least one dielectric layer, said first dielectric layer being situated upon said second dielectric layer;
   said titanium layer has a thickness in a range from about 100 to about 300 Å;
   said titanium nitride layer has a thickness of about 300 Å;
   diffusing said nitrogen through at least a portion of said titanium nitride layer is conducted during RTA for a time range from about 10 to about 60 seconds at a temperature range from about 200 to about 800° C.; and
   said depression is substantially filled with said aluminum layer by PVD at an energy rate not greater than about 16 kW with an applied pressure to said aluminum layer in a pressure range from about 700 to about 750 atm at a temperature range from about 400 to about 550° C. for a time range from about one to about four minutes.

8. A method of forming an electrical connection according to claim 1, further comprising following said substantially filling:
   thermal processing said semiconductor structure whereby said first layer migrates to a position situated above said at least one dielectric layer.

9. A method of forming an electrical connection comprising sequentially:
   forming a depression in a semiconductor structure, said depression being defined by at least one dielectric layer in said semiconductor structure;
   forming a titanium layer substantially conformably within said depression;
   forming a first silicon layer within said depression upon said titanium layer;
   forming a substantially continuous titanium silicide film from said titanium layer and said first silicon layer;
   forming a first germanium layer substantially conformably within said depression; and
   substantially filling said depression with an aluminum layer.

10. A method of forming an electrical connection according to claim 9, wherein said depression terminates at a second silicon layer in said semiconductor structure, said second silicon layer being exposed by forming said depression in said semiconductor structure, and wherein forming said substantially continuous titanium silicide film from said titanium layer and said first silicon layer further comprises forming titanium silicide upon said exposed second silicon layer.

11. A method of forming an electrical connection according to claim 10, wherein:
   said depression has an aspect ratio of about 8:1;
   said titanium layer has a thickness of about 100 Å;
   said first silicon layer has a thickness of about 200 Å;
   forming said substantially continuous titanium silicide film from said titanium layer and said first silicon layer is conducted during RTA for a time range from about 10 to about 60 seconds at a temperature range from about 200 to about 800° C. wherein said RTA forms a substantially continuous titanium silicide layer upon a sidewall of said depression;
   said first germanium layer has a thickness in a range from about 100 Å to about 300 Å;
   said depression is substantially filled with said aluminum layer by PVD at an energy rate not greater than about 16 kW by applying a pressure to said aluminum layer in a pressure range from about 700 to about 750 atm at a temperature range from about 400° C. to about 550° C. for a time range from about one to about four minutes.

12. A method of forming an electrical connection according to claim 10, further comprising, following substantially filling said depression, thermal processing said semiconductor structure whereby unreacted portions of said first silicon layer and said first germanium layer migrate to a position situated above said at least one dielectric layer.

13. A method of forming an electrical connection according to claim 9, wherein:
   said depression is a trench that extends through a first dielectric layer of said at least one dielectric layer and not extending through a second dielectric layer of said at least one dielectric layer, said first dielectric layer being situated upon said second dielectric layer;
   said titanium layer has a thickness of about 100 Å;
   said first silicon layer has a thickness of about 200 Å;
   forming a substantially continuous titanium silicide film from said titanium layer and said first silicon layer is conducted by RTA for a time range from about seconds to about 60 seconds at a temperature range from about 200 to about 800° C., wherein said RTA forms a substantially continuous titanium silicide layer upon a sidewall of said depression;
   said first germanium layer has a thickness in a range from about 100 Å to about 300 Å;
   said depression is substantially filled with said aluminum layer by PVD at an energy rate not greater than about 16 kW by applied pressure to said aluminum layer in a pressure range of from about 700 atm to about 750 atm at a temperature range from about 400° C. to about 550° C. for a time range from about one to about four minutes.

14. A method of forming an electrical connection according to claim 9, further comprising, following substantially filling said depression, thermal processing said semiconductor structure whereby unreacted portions of said first silicon layer and said first germanium layer migrate to a position situated above said at least one dielectric layer.

15. A method of forming an electrical connection according to claim 9, further comprising, following substantially filling said depression, removing substantially all material situated above said at least one dielectric layer.

16. A method of forming an electrical connection comprising sequentially:
  forming a depression in a semiconductor structure, said depression being defined by at least one dielectric layer in said semiconductor structure;
  forming a titanium layer conformably within said depression;
  forming a germanium layer conformably within said depression; and
  substantially filling said depression with an aluminum layer wherein said depression is an interconnect opening having an aspect ratio of about 8:1, forming said titanium layer is conducted by PVD, and said aluminum layer is deposited by PVD in a two-step process each at a temperature in the range from about 250° C. to about 450° C.

17. A method of forming an electrical connection according to claim 16, wherein said depression terminates at a silicon layer in said semiconductor structure, said silicon layer being exposed by forming said depression in said semiconductor structure.

18. A method of forming an electrical connection according to claim 16, wherein forming said germanium layer is conducted by CVD.

19. A method of forming an electrical connection according to claim 16, wherein forming said germanium layer is conducted by PVD.

20. A method of forming an electrical connection according to claim 16, wherein:
  said depression is a trench that extends through a first dielectric layer of said at least one dielectric layer and not extending through a second dielectric layer of said at least one dielectric layer, said first dielectric layer being situated upon said second dielectric layer;
  forming said titanium layer is conducted by PVD; and
  said aluminum layer is deposited by PVD in a two-step process at a temperature in the range of from about 250° C. to about 450° C.

21. A method of forming an electrical connection according to claim 16, further comprising, following substantially filling said depression, removing substantially all material situated above said at least one dielectric layer.

* * * * *

UNITED STATES PATENT AND TRADEMARK OFFICE
CERTIFICATE OF CORRECTION

PATENT NO. : 6,200,895 B1
DATED : March 13, 2001
INVENTOR(S) : John H. Givens and E. Allen McTeer It is certified that error appears in the above-identified patent and that said Letters Patent is hereby corrected as shown below:

Column 1,
Line 31, please change "lateral and vertical" to -- laterally and vertically --

Column 2,
Line 17, please change "bread-loafing" to -- bread loafing --

Column 3,
Line 39, please change "includes" to -- include --

Column 7,
Lines 5 and 6, please change "suicides" to -- silicides --

Column 10,
Line 47, please insert a comma after "contains"

Column 13,
Line 12, please change "pre3" to -- pre- --

Column 14,
Line 37, please change "1,200 ÅA" to -- 1,200 Å --

Column 16,
Line 35, please change "is formation" to -- is a formation --

Column 18,
Line 64, please change "it's" to -- its --

UNITED STATES PATENT AND TRADEMARK OFFICE
CERTIFICATE OF CORRECTION

PATENT NO. : 6,200,895 B1
DATED : March 13, 2001
INVENTOR(S) : John H. Givens and E. Allen McTeer It is certified that error appears in the above-identified patent and that said Letters Patent is hereby corrected as shown below:

Column 19,
Line 51, please change "then re-subjected" to -- then be re-subjected --

Column 22,
Line 48, please change "about seconds" to -- about 10 seconds --

Signed and Sealed this

Ninth Day of April, 2002

*Attest:*

JAMES E. ROGAN
*Director of the United States Patent and Trademark Office*

*Attesting Officer*